US011899503B2

(12) United States Patent
Nguyen Van et al.

(10) Patent No.: US 11,899,503 B2
(45) Date of Patent: Feb. 13, 2024

(54) ELECTRONIC DEVICE INCLUDING ADHESIVE PORTION

(71) Applicant: Samsung Electronics Co., Ltd., Suwon-si (KR)

(72) Inventors: Hoang Nguyen Van, Hanoi (VN); Tri Bui Dac, Hai Duong (VN); Dieu Le Hoang, Ha Noi (VN); Thang Ngo Van, Thanh Hoa (VN); Trung Nguyen Duc, Hai Duong (VN)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/728,209

(22) Filed: Apr. 25, 2022

(65) Prior Publication Data

US 2022/0253107 A1 Aug. 11, 2022

Related U.S. Application Data

(63) Continuation of application No. PCT/KR2020/012317, filed on Sep. 11, 2020.

(30) Foreign Application Priority Data

Dec. 20, 2019 (KR) .................... 10-2019-0171917

(51) Int. Cl.
*G06F 1/16* (2006.01)
*H04M 1/02* (2006.01)

(52) U.S. Cl.
CPC .......... *G06F 1/1656* (2013.01); *H04M 1/026* (2013.01)

(58) Field of Classification Search
CPC ... G06F 1/1656; H04M 1/026; H04M 1/0249; H04M 1/0269; H04M 1/18; C09J 11/04; H05K 5/00
See application file for complete search history.

(56) References Cited

U.S. PATENT DOCUMENTS 9,551,890 B2 1/2017 Yamashita et al.
9,947,989 B2 4/2018 Hyun et al.
(Continued)

FOREIGN PATENT DOCUMENTS

JP 5511094 B2 6/2014
JP 2015-144410 A 8/2015
(Continued)

OTHER PUBLICATIONS

International Search Report dated Dec. 21, 2020, issued in an International Application No. PCT /KR2020/012317.

*Primary Examiner* — Anthony Q Edwards
*Assistant Examiner* — Hung Q Dang
(74) *Attorney, Agent, or Firm* — Jefferson IP Law, LLP

(57) ABSTRACT

An electronic device is provided. The electronic device includes a first housing, a second housing coupled to the first housing, a plurality of first adhesive portions arranged between the first housing and the second housing, and spaced apart from each other along a first perimeter portion of the first housing, and a plurality of second adhesive portions arranged between the plurality of first adhesive portions and arranged along a second perimeter portion of the first housing, wherein the first adhesive portions include an adhesive support portion extending in one direction and a first adhesive material arranged on one side or both sides of the adhesive support portion, and the second adhesive portions include a second adhesive material.

19 Claims, 21 Drawing Sheets

(56) References Cited

U.S. PATENT DOCUMENTS

| | | |
|---|---|---|
| 10,631,437 B2 | 4/2020 | Fournier et al. |
| 10,721,830 B2 | 7/2020 | Cha |
| 10,860,061 B2 | 12/2020 | Park et al. |
| 11,604,374 B2 * | 3/2023 | Azuma ............. G02F 1/133308 |
| 2014/0160645 A1 | 6/2014 | Lu |
| 2019/0239374 A1 | 8/2019 | Cha |
| 2021/0168230 A1 * | 6/2021 | Baker .................. H04M 1/026 |

FOREIGN PATENT DOCUMENTS

| | | |
|---|---|---|
| KR | 10-2013-0128077 A | 11/2013 |
| KR | 10-2018-0071608 A | 6/2018 |
| KR | 10-2018-0113219 A | 10/2018 |
| KR | 10-2019-0085199 A | 7/2019 |
| WO | 20145680 A1 | 1/2014 |

* cited by examiner

ELECTRONIC DEVICE INCLUDING ADHESIVE PORTION

CROSS-REFERENCE TO RELATED APPLICATION(S)

This application is a continuation application, claiming priority under § 365(c), of an International application No. PCT/KR2020/012317, filed on Sep. 11, 2020, which is based on and claims the benefit of a Korean patent application number 10-2019-0171917, filed on Dec. 20, 2019, in the Korean Intellectual Property Office, the disclosure of which is incorporated by reference herein in its entirety.

BACKGROUND

1. Field

The disclosure relates to an electronic device including an adhesive portion.

2. Description of Related Art

In response to demand of consumers who value aesthetics of electronic devices, recent electronic devices including smartphones, tablet personal computers (PCs), wearable devices, etc. have been provided with three-dimensional (3D) exteriors including curved structures. In an electronic device, a window or one or more second housings may be mounted onto one side or both sides of a first housing. The first housing may be coupled to the window or the one or more second housings by using adhesive portions.

When the first housing and the window or the one or more second housings corresponding thereto have 3D exteriors, an adhesive portion provided in the shape of a two-dimensional (2D) plane may be deformed in a portion formed in a 3D structure, for example, a portion having a curved surface, causing creases at the 2D plane adhesive portion. The adhesive portion arranged between the first housing and the window or the one or more second housings may not only combine the first housing and the window or the one or more second housings, but also, by forming a sealed structure, perform water and dust proof functions to prevent foreign materials from infiltrating into a main body.

When the adhesive portion provided as a 2D plane between the first housing and the window or the second housing is deformed and creased, not only may the adhesive function of the adhesive portion be deteriorated, but the water and dust proof functions that prevent foreign materials from permeating into the main body may be affected.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device in which different adhesive portions are arranged in correspondence with a main body housing having a three-dimensional (3D) structure and one or more case portions, such that deformation of adhesive portions may be minimized.

Another aspect of the disclosure is to provide an electronic device in which adhesive portions are arranged in a receiving portion of a housing.

Another aspect of the disclosure is to provide an electronic with improved adhesive property and dust and water proof function of adhesive portions.

Additional aspects will be set forth in part in the description which follows and, in part, will be apparent from the description, or may be learned by practice of the presented embodiments.

In accordance with an aspect of the disclosure, an electronic device is provided. The electronic device includes a first housing, a second housing coupled to the first housing, a plurality of first adhesive portions arranged between the first housing and the second housing, and spaced apart from each other along a first perimeter portion of the first housing, and a plurality of second adhesive portions arranged between the plurality of first adhesive portions and arranged along a second perimeter portion of the first housing, wherein the first adhesive portions include an adhesive support portion extending in one direction and a first adhesive material arranged on one side or both sides of the adhesive support portion, and the second adhesive portions include a second adhesive material.

The second perimeter portion and the first perimeter portion may have a curved surface structure bent in a thickness direction of the electronic device, and a curvature of the second perimeter portion extending along a plane perpendicular to the thickness direction of the electronic device may exceed a curvature of the first perimeter portion.

The electronic device may further include a protruding support portion protruding in a thickness direction of the electronic device and arranged apart from the second adhesive portions.

The first adhesive portions may have a first thickness in the thickness direction of the electronic device, the protruding support portion may have a second thickness in the thickness direction of the electronic device, and the second thickness may be greater than or equal to 50% of the first thickness.

The first adhesive portions may include a first joint portion at both ends, and the second adhesive portions may include at both ends a second joint portion connected to the first joint portion, wherein the first joint portion may have a protruding shape, and the second joint portion may have a grooved shape corresponding to the protruding shape.

The first adhesive portions may include a first joint portion at both ends, and the second adhesive portions may include at both ends a second joint portion connected to the first joint portion, wherein the first joint portion and the second joint portion may be formed in zigzags, corresponding to each other.

The electronic device may further include an adhesive portion accommodating portion arranged along the second perimeter portion, recessed downwards in a thickness direction of the electronic device, and accommodating some of the second adhesive portions.

A lower surface of the adhesive portion accommodating portion may include one or more structures from a stepped portion, a recessed portion, and a convex portion.

The electronic device may further include an adhesive portion support portion protruding in the thickness direction of the electronic device and arranged apart from the adhesive portion accommodating portion.

The adhesive portion support portion may extend along the second perimeter portion of the first housing.

There may be a plurality of adhesive portion support portions, and the plurality of adhesive portion support portions may be spaced apart from each other along the second perimeter portion of the first housing.

The electronic device may further include a first adhesive portion channel extending from the adhesive portion accommodating portion.

The electronic device may further include a second adhesive portion channel spaced apart and extending from the adhesive portion accommodating portion.

The adhesive portion accommodating portion may include a first adhesive portion accommodating portion and a second adhesive portion accommodating portion spaced apart from each other.

The electronic device may further include a third adhesive portion channel connecting the first adhesive portion accommodating portion to the second adhesive portion accommodating portion.

The electronic device may further include a protruding support portion protruding in a thickness direction of the electronic device and spaced apart from the second adhesive portions, and the protruding support portion may be arranged between the first adhesive portion accommodating portion and the second adhesive portion accommodating portion.

The electronic device may further include a third adhesive portion connected to the first adhesive portion and having a width less than that of the first adhesive portion, and the third adhesive portion may extend along the second perimeter portion.

The third adhesive portion may include a slit.

The second adhesive material may be a thermosetting or photocurable second adhesive material.

The second adhesive material may have an elasticity or a strain greater than an elasticity or a strain of the adhesive support portion.

In an electronic device according to an embodiment, different adhesive portions are arranged in correspondence with a first housing including a three-dimensional (3D) structure and a window or one or more second housings, such that deformation of adhesive portions may be minimized.

An electronic device according to an embodiment may prevent exposure of adhesive portions to the outside.

An electronic device according to an embodiment may improve adhesive property of the adhesive portions and dust and water proof function.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1A:
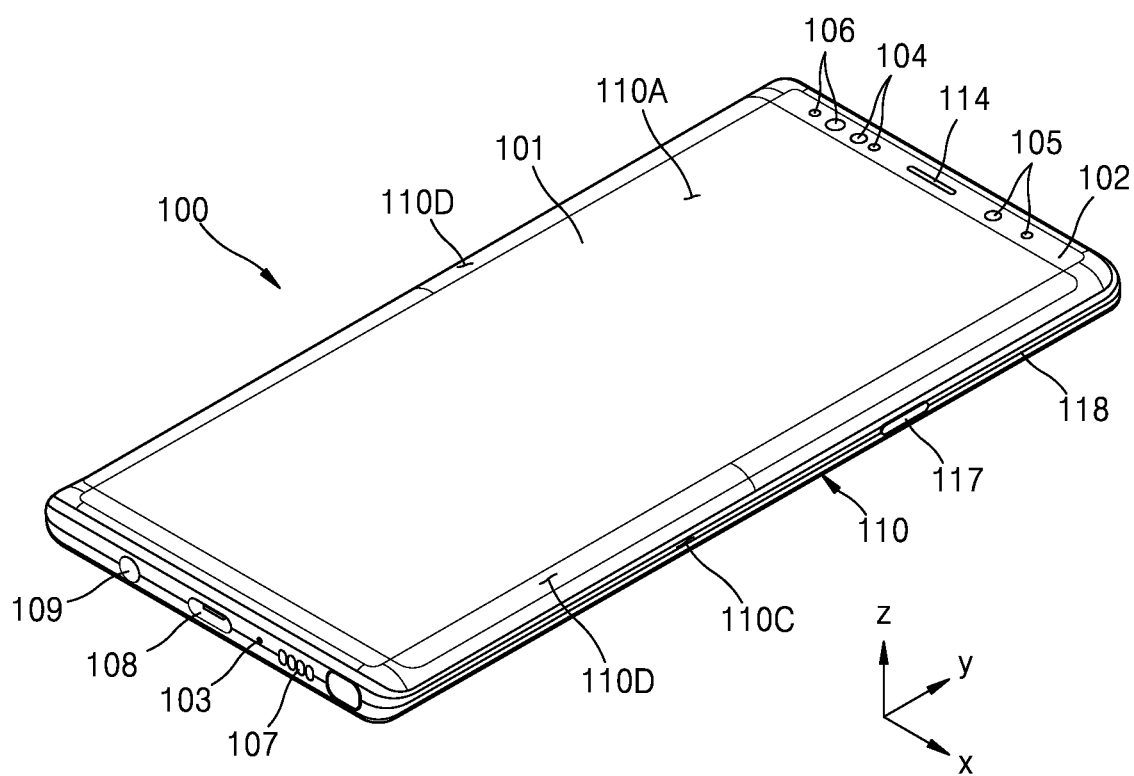
FIG. 1A is a perspective view of a front surface of a mobile electronic device, according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Although terms used in the disclosure are selected with general terms popularly used at present under the consideration of functions in the disclosure, the terms may vary according to the intention of those of ordinary skill in the art, judicial precedents, or introduction of new technology. Further, in certain cases, terms have been arbitrarily selected by the applicant, and in such cases, meanings of the terms will be described in detail in corresponding descriptions. Accordingly, the terms used in the embodiments should be defined based on their meanings and overall descriptions of the embodiments, not simply by their names.

In the specification, when a portion "includes" an element, another element may be further included, rather than excluding the existence of the other element, unless otherwise described.

The terms "first", "second", etc., will be used to distinguish one component from another component, rather than for a restrictive meaning.

Hereinafter, embodiments of the disclosure will be described in detail with reference to the attached drawings to allow those of ordinary skill in the art to easily carry out the embodiments of the disclosure. However, the disclosure may be implemented in various forms, and are not limited to the embodiments described herein. To clearly describe the disclosure, parts that are not associated with the description have been omitted from the drawings, and throughout the specification, identical reference numerals refer to identical parts.

An electronic device according to various embodiments of the disclosure may include at least one of a smart phone, a tablet personal computer (PC), a mobile phone, a video phone, an electronic book (e-book) reader, a desktop PC, a laptop PC, a netbook computer, a workstation, a server, a personal digital assistant (PDA), a portable multimedia player (PMP), an MP3 player, mobile medical equipment, a camera, or a wearable device (e.g., smart glasses, a head-mounted-device (HMD), electronic clothes, an electronic bracelet, an electronic necklace, an electronic appcessory, electronic tattoos, a smart mirror, or a smart watch).

According to some embodiments, the electronic device may be a smart home appliance. The smart home appliance may include, for example, at least one of a Television (TV), a Digital Video Disk (DVD) player, audio equipment, a refrigerator, an air conditioner, a vacuum cleaner, an oven, a microwave oven, a laundry machine, an air cleaner, a set-top box, a home automation control panel, a security control panel, a TV box (e.g., Samsung HomeSync™, Apple TV™, or Google TV™), a game console (e.g., Xbox™, PlayStation™), an electronic dictionary, an electronic key, a camcorder, or an electronic frame.

In another embodiment, the electronic device may include at least one of various medical equipment (for example, magnetic resonance angiography (MRA), magnetic resonance imaging (MRI), computed tomography (CT), an imaging device, or an ultrasonic device), a navigation system, a global positioning system (GPS) receiver, an event data recorder (EDR), a flight data recorder (FDR), a vehicle infotainment device, electronic equipment for ships (e.g., a navigation system and gyro compass for ships), avionics, a security device, a vehicle head unit, an industrial or home robot, an automatic teller's machine (ATM), a point of sales (POS), or Internet of things (e.g., electric bulbs, various sensors, electricity or gas meters, sprinkler devices, fire alarm devices, thermostats, streetlights, toasters, exercise machines, hot-water tanks, heaters, boilers, and so forth).

According to some embodiments, the electronic device may include at least one of a part of a furniture or building/structure, an electronic board, an electronic signature receiving device, a projector, or various measuring instruments (e.g., a water, electricity, gas, electric wave measuring device, etc.). The electronic device according to various embodiments may be one of the above-listed devices or a combination thereof. The electronic device according to some embodiments may be a flexible electronic device. The electronic device according to various embodiments is not limited to the above-listed devices and may include new electronic devices according to technical development.

Hereinafter, an electronic device according to various embodiments will be described with reference to the accompanying drawings. Herein, the term "user" used in various embodiments of the disclosure may refer to a person who uses the electronic device or a device using the electronic device (e.g., an artificial intelligence electronic device).

FIG. 1A is a perspective view of a front surface of a mobile electronic device, according to an embodiment of the disclosure.

Figure 1B:
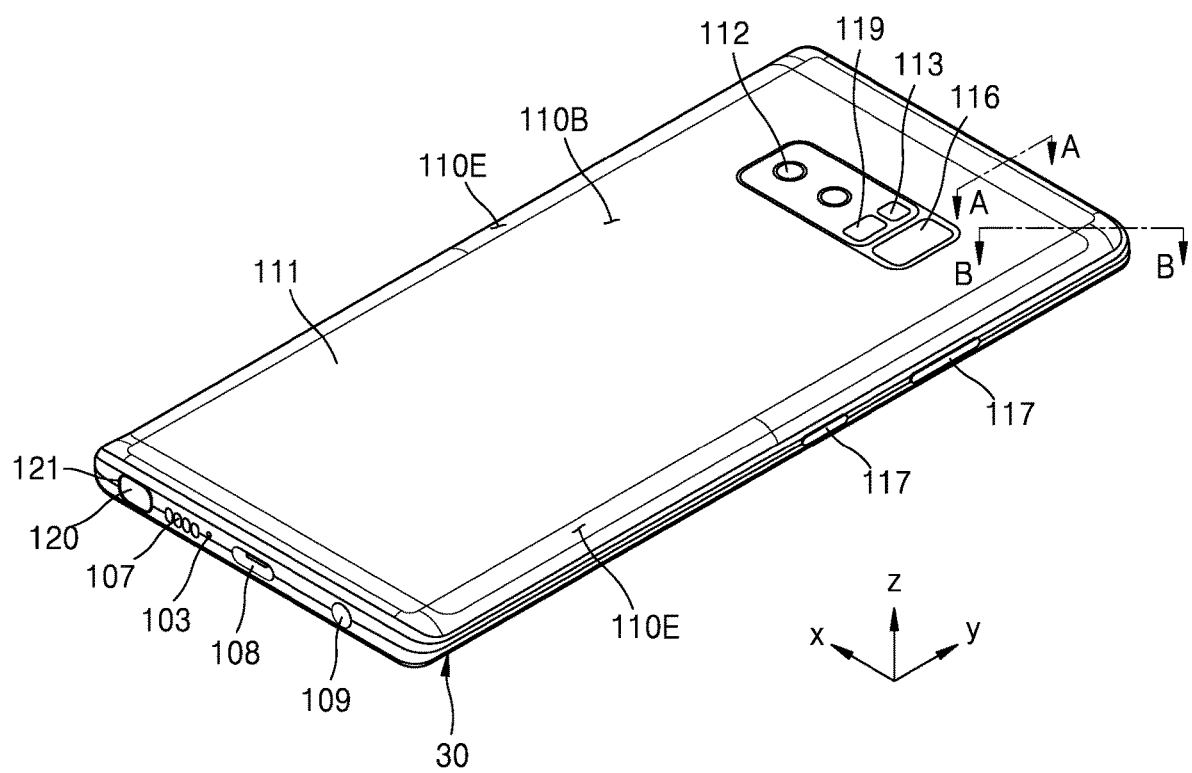
FIG. 1B is a perspective view of a rear surface of the electronic device of FIG. 1A according to an embodiment of the disclosure.

FIG. 1B is a perspective view of a rear surface of the electronic device of FIG. 1A according to an embodiment of the disclosure.

Figure 2A:
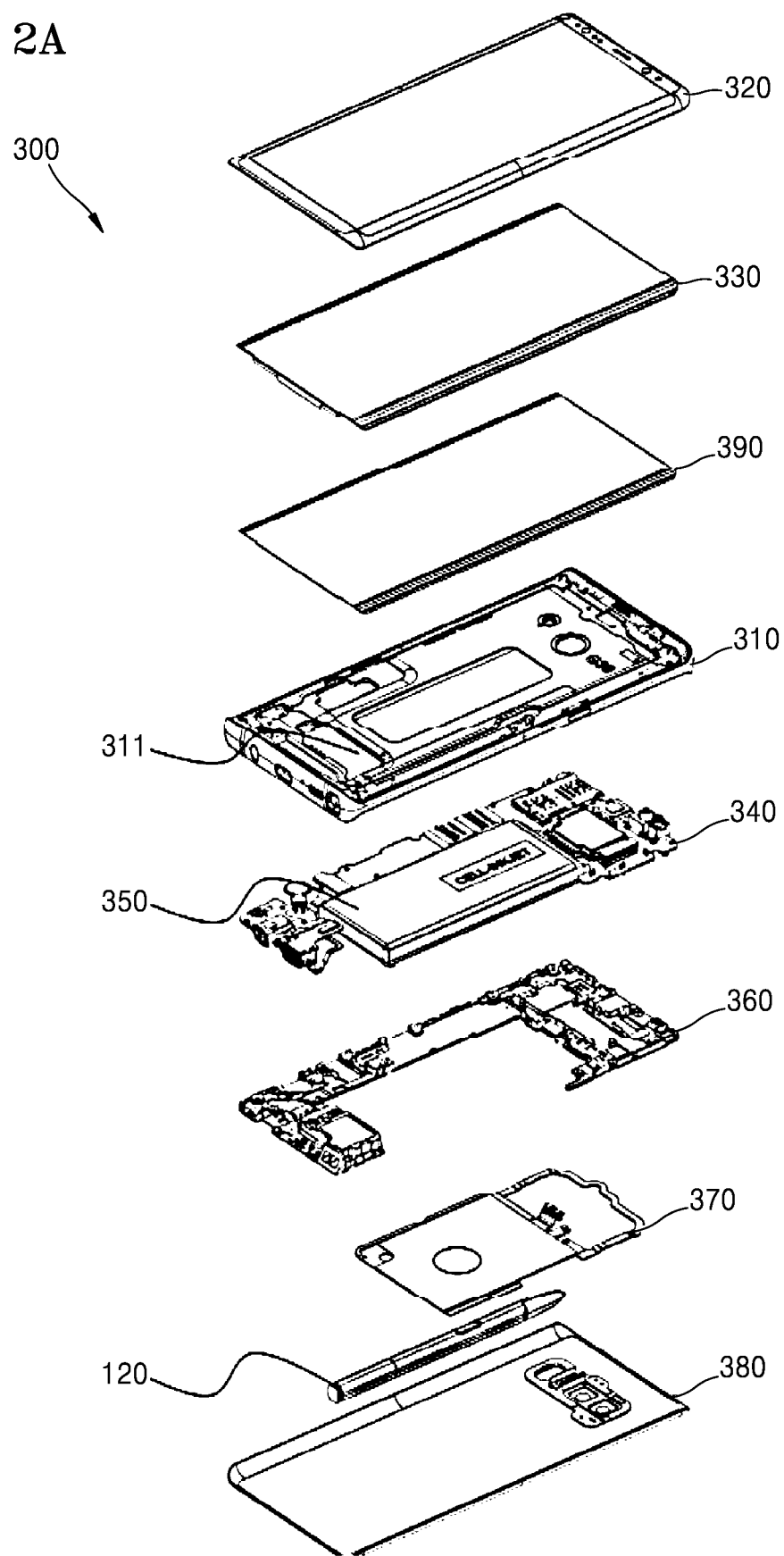
FIG. 2A is an exploded perspective view of the electronic device of FIG. 1A according to an embodiment of the disclosure.

FIG. 2A is an exploded perspective view of the electronic device of FIG. 1A according to an embodiment of the disclosure.

Figure 2B:
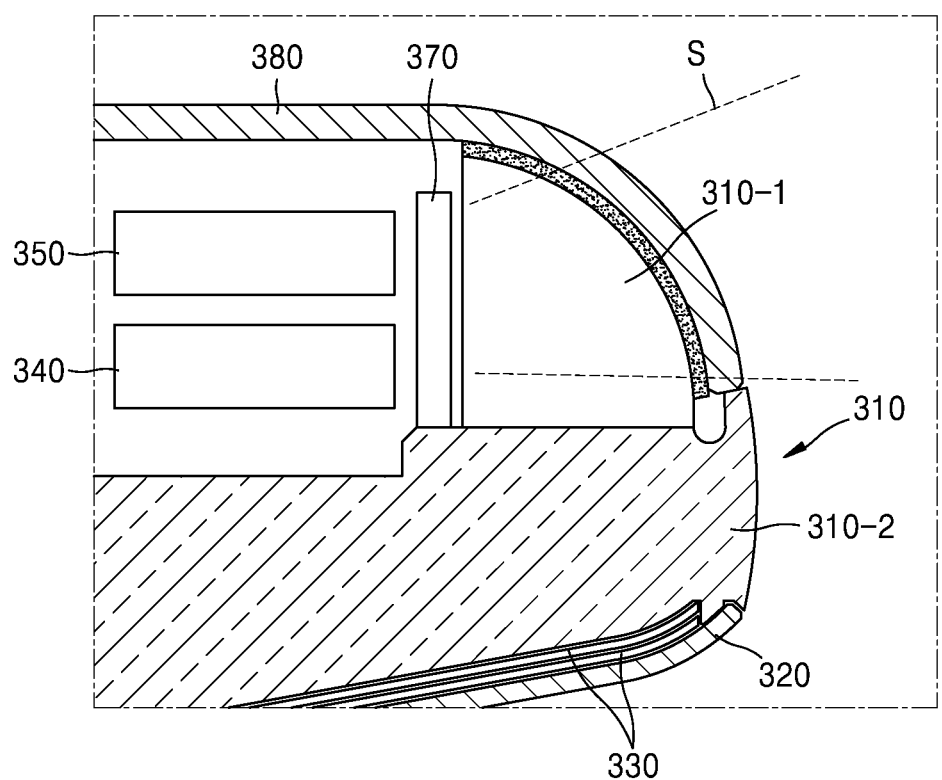
FIG. 2B is a schematic side cross-sectional view of an electronic device according to an embodiment of the disclosure.

FIG. 2B is a schematic side cross-sectional view of an electronic device according to an embodiment of the disclosure.

Referring to FIGS. 1A and 1B, an electronic device 100 according to an embodiment may include a first housing 110 that includes a first surface (or, a front surface) 110A, a second surface (or, a rear surface) 110B, and a lateral surface 110C surrounding a space between the first surface 110A and the second surface 110B. In another embodiment (not shown), the housing may refer to a structure that forms some of the first surface 110A, the second surface 110B, and the lateral surface 110C of FIG. 1. According to an embodiment, the first surface 110A may be formed by a front plate 102, at least a part of which is substantially transparent (for example, a glass plate including various coating layers, or a polymer plate). The second surface 110B may be formed by a second housing 111 that is substantially opaque. The second housing 111 may be formed by, for example, coated or painted glass, ceramic, polymer, metal (e.g., aluminum, stainless steel (STS), or magnesium) or a combination of at least two of the listed materials. The lateral surface 110C may be formed by a lateral bezel structure (or, a lateral member) 118 coupled to the front plate 102 and the second housing 111 and including a metal and/or polymer. In an embodiment, the second housing 111 and the lateral bezel structure 118 may be formed as one piece and may include the same material (e.g., a metal material such as aluminum).

In embodiments illustrated in the drawings, the front plate 102 may include two first regions 110D bent towards the second housing 111 and seamlessly extending from the first surface 110A at both ends of a long edge of the front plate 102. In embodiments illustrated in the drawings, the second housing 111 may include two second regions 110E bent towards the front plate 102 and seamlessly extending from the second surface 110B at both ends of a long edge. In an embodiment, the front plate 102 (or, the second housing 111) may include only one of the first regions 110D (or, the second regions 110E). In another embodiment, some of the first regions 110D or the second regions 110E may not be included. In the embodiments described above, when seen from a lateral side of the electronic device 100, the lateral bezel structure 118 may have a first thickness (or width) at a lateral side which does not include the first regions 110D or the second regions 110E, and may have a second thickness thinner than the first thickness at another lateral side which includes the first regions 110D or the second regions 110E.

According to an embodiment, the electronic device 100 may include at least one of a display 101, audio modules 103, 107, and 114, sensor modules 104, 116, and 119, camera modules 105, and 112, a key input device 117, a light emitting device 106, a pen input device 120, or connector holes 108 and 109. In an embodiment, the electronic device 100 may exclude at least one (e.g., the key input device 117 or the light emitting device 106) of the components or further include other components.

The display 101 may be exposed through the most part of, for example, the front plate 102. In an embodiment, at least a part of the display 101 may be exposed through the front plate 102 forming the first surface 110A and the first regions 110D of the lateral surface 110C. In an embodiment, edges of the display 101 may be formed substantially identical to an adjacent outer shape of the front plate 102. In another embodiment (not shown), to increase an exposed area of the display 101, a space between an outer shape of the display 101 and the outer shape of the front plate 102 may be formed to be substantially constant.

In another embodiment (not shown), a recess or an opening may be formed in a part of a displaying area of the display 101, and the electronic device 100 may include at least one of the audio module 114, the sensor module 104, the camera module 105, or the light emitting device 106, which are aligned with the recess or the opening. In another embodiment (not shown), the electronic device 100 may include at least one of the audio module 114, the sensor module 104, the camera module 105, the fingerprint sensor module 116, or the light emitting device 106 arranged on a rear side of the displaying area of the display 101. In another embodiment (not shown), the display 101 may be coupled with or arranged adjacent to a touch sensing circuit, a pressure sensor capable of measuring a strength (pressure) of a touch, and/or a digitizer for detecting a stylus pen of a magnetic-field type. In an embodiment, at least a part of the sensor modules 104 and 119 and/or at least a part of the key input device 117 may be arranged in the first regions 110D and/or the second regions 110E.

The audio modules 103, 107, and 114 may include a microphone hole 103 and speaker holes 107 and 114. Inside the microphone hole 103 may be arranged a microphone for obtaining external sound, and may also be arranged a plurality of microphones for sensing a direction of the sound in an embodiment. The speaker holes 107 and 114 may include an external speaker hole 107 and a call receiver hole 114. In an embodiment, the speaker holes 107 and 114 and the microphone hole 103 may be implemented as one hole or a speaker may be included without the speaker holes 107 and 114 (e.g., a piezo speaker).

The sensor modules 104, 116, and 119 may generate an electrical signal or data value corresponding to an internal operating state or external environmental state of the electronic device 100. The sensor modules 104, 116, and 119 may include, for example, a first sensor module 104 (e.g., a proximity sensor) arranged on the first surface 110A of the first housing 110 and/or a sensor module (not shown) (e.g., a fingerprint sensor) and/or a third sensor module 119 (e.g., a heart rate monitoring (HRM) sensor) arranged on the second surface 110B of the first housing 110 and/or a fourth sensor module 116 (e.g., a fingerprint sensor). The fingerprint sensor may be arranged on the second surface 110B of the first housing 110 as well as the first surface 110A of the first housing 110 (e.g., the display 101). The electronic device 100 may further include at least one of sensor modules (not shown), e.g., a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, and 112 may include a first camera device 105 arranged on the first surface 110A of the electronic device 100, a second camera device 112 arranged on the second surface 110B, and/or a flash 113. The camera devices 105 and 112 may include one lens or a plurality of lenses, an image sensor, and/or an image signal processor. The flash 113 may include, for example, a light-emitting diode or a xenon lamp. In an embodiment, two or more lenses (an IR camera, a wide lens, and a telephoto lens) and image sensors may be arranged on a surface of the electronic device 100.

The key input device 117 may be arranged on the lateral surface 110C of the first housing 110. In another embodiment, the electronic device 100 may exclude a part or all of the above-mentioned key input device 117, and the excluded key input device 117 may be implemented in other forms such as a soft key, etc., on the display 101. In an embodiment, the key input device may include the sensor module 116 arranged on the second surface 110B of the first housing 110.

The light emitting device 106 may be arranged, for example, on the first surface 110A of the first housing 110. The light emitting device 106 may provide, for example, state information of the electronic device 100 in the form of light. In another embodiment, the light emitting device 106 may provide, for example, a light source interoperating with operations of the camera module 105. The light emitting device 106 may include, for example, a light emitting diode (LED), an IR LED, and a xenon lamp.

The connector holes 108 and 109 may include a first connector hole 108 capable of accommodating a connector (e.g., a universal serial bus (USB) connector) for transmitting and receiving power and/or data with an external electronic device and/or a second connector hole (e.g., an earphone jack) 109 capable of accommodating a connector for transmitting and receiving an audio signal with the external electronic device.

The pen input device 120 (e.g., a stylus pen) may be inserted into or detached from the first housing 110 through a hole 121 formed on a lateral side of the first housing 110, and may include a button to facilitate the insertion and detachment. A separate resonance circuit may be embedded in the pen input device 120 to be interoperated with an electromagnetic induction panel 390 (e.g., a digitizer) included in the electronic device 100. The pen input device 120 may include an electro-magnetic resonance (EMR) method, an active electrical stylus (AES) method, and an electric coupled resonance (ECR) method.

Referring to FIG. 2A, an electronic device 300 may include a first housing 310, a first support member 311 (e.g., a bracket), a front plate 320, a display 330, the electromagnetic induction panel 390, a printed circuit board 340, a battery 350, a second support member 360, an antenna 370, the pen input device 120, and a second housing 380. In an embodiment, the electronic device 300 may exclude at least one (e.g., the first support member 311 or the second support member 360) of the components or further include other components. At least one of the components of the electronic device 300 may be identical or similar to at least one of the components of the electronic device 100 of FIG. 1A or 1B, and redundant descriptions thereof will not be provided.

The electromagnetic induction panel 390 (e.g., a digitizer) may by a panel to sense an input from the pen input device 120. For example, the electromagnetic induction panel 390 may include a printed circuit board (PCB) (e.g., a flexible PCB; FPCB) and a shielding sheet. The shielding sheet may prevent mutual interference among components included in the electronic device 100 (e.g., a display module, a PCB, an electromagnetic induction panel, etc.) caused by an electromagnetic field generated from the aforementioned components. As the shielding sheet blocks an electromagnetic field generated from the components, an input from the pen input device 120 may be accurately transmitted to a coil included in the electromagnetic induction panel 390. The electromagnetic induction panel 390 according to various embodiments may include an opening formed in at least some areas corresponding to a biosensor mounted on the electronic device 100.

The first support member 311 may be arranged in the electronic device 300 and connected to the first housing 310, or may be integrated with the first housing 310. The first support member 311 may be formed of, for example, a metal material and/or a non-metallic (e.g., polymer) material. The first support member 311 may be coupled with the display 330 on a surface thereof and with the printed circuit board 340 on another surface thereof. A processor, a memory, and/or an interface may be mounted on the printed circuit board 340. The processor may include one or more of, for example, a central processing unit, an application processor, a graphic processor, an image signal processor, a sensor hub processor, and a communication processor.

The memory may include, for example, a volatile memory or a nonvolatile memory.

An interface may include, for example, a high definition multimedia interface (HDMI), a universal serial bus (USB) interface, a secure digital (SD) card interface, and/or an audio interface. The interface may electrically or physically connect, for example, the electronic device 300 with an external electronic device, and may include an USB connector, an SD card/MMC connector, or an audio connector.

The battery 350 may be a device for supplying power to at least one component of the electronic device 300, and may include, e.g., a primary cell which is not rechargeable, a secondary cell which is rechargeable, or a fuel cell. At least a part of the battery 350 may be arranged on substantially the same plane as, for example, the printed circuit board 340. The battery 350 may be arranged as one piece inside the electronic device 300 or may be arranged removably from the electronic device 300.

The antenna 370 may be arranged between the second housing 380 and the battery 350. The antenna 370 may include, for example, a near field communication (NFC) antenna, a wireless charging antenna, and/or a magnetic secure transmission (MST) antenna. The antenna 370 may perform short-range communication or wirelessly transmit and receive power needed for charging, with, for example, an external device. In another embodiment, an antenna structure may be formed by a part or a combination of the first housing 310 and/or the first support member 311.

Referring to FIG. 2B, the antenna 370 may be arranged to include a certain signal emission region S. In 5G, the emission region S of an antenna signal has been expanded. Accordingly, to expand the emission region S of the antenna signal transmitted from the antenna 370 arranged at a lateral side of the first housing 310, the structure of the first housing 310 has been changed as well. For example, the first housing 310 may include a first housing area 310-1 including a nonconductive material passing through the emission region S of the antenna signal and a second housing area 310-2 including a conductive material blocking the emission region S of the antenna signal, e.g., a metal. At this time, the first housing area 310-1 may include a sidewall structure for accommodating components to be accommodated therein, for example, the printed circuit board 340, the battery 350, and the antenna 370, and accordingly, the second housing 380 may also have a 3D curved structure corresponding to the shape of the first housing area 310-1. Thus, the shape of adhesive portion attaching the first housing 310 to the second housing 380 may also have a 3D curved structure.

Figure 3A:
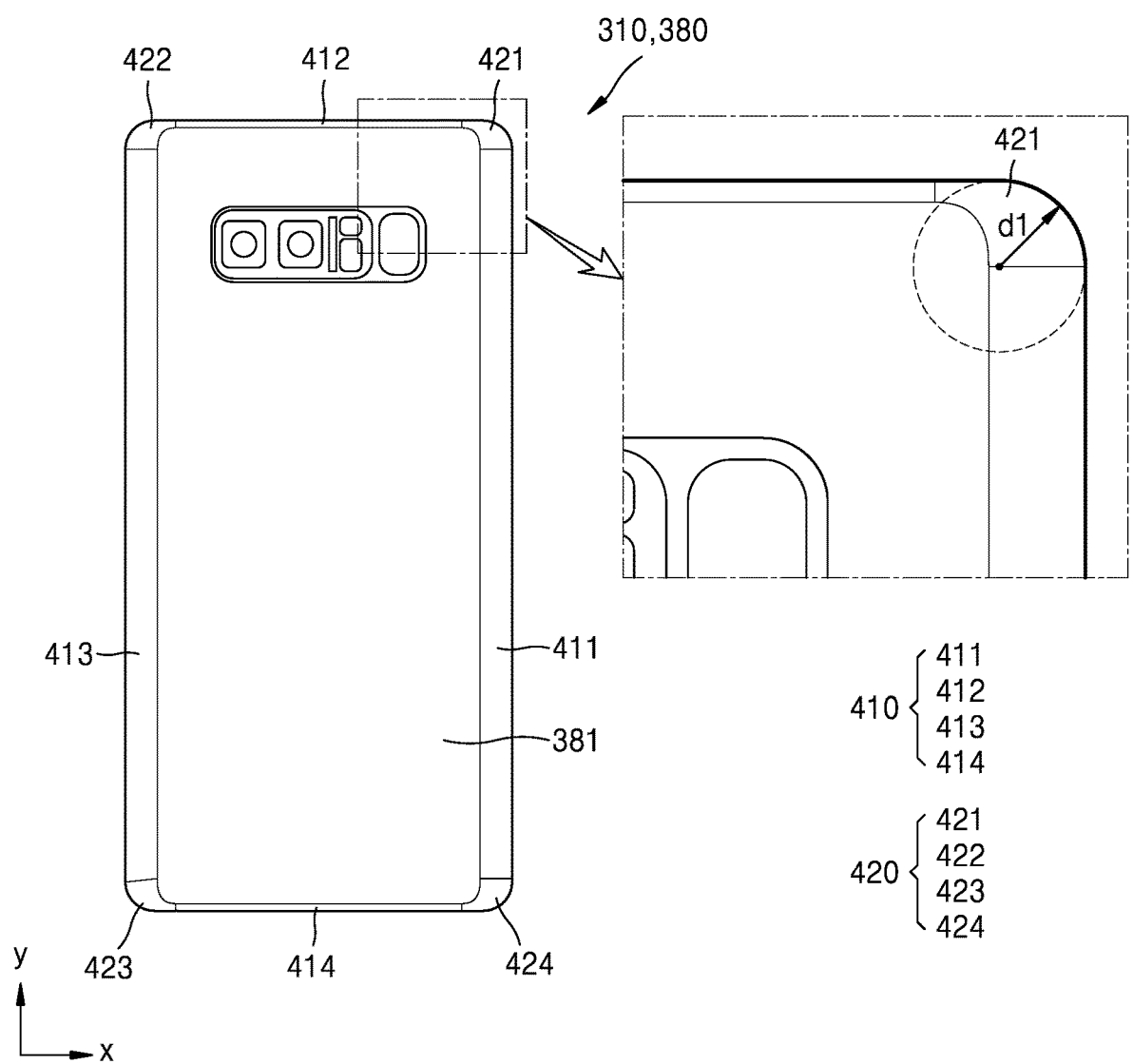
FIG. 3A is a rear view of the electronic device of FIG. 1A, according to an embodiment of the disclosure.

FIG. 3A is a rear view of an electronic device according to an embodiment of the disclosure.

Figure 3B:
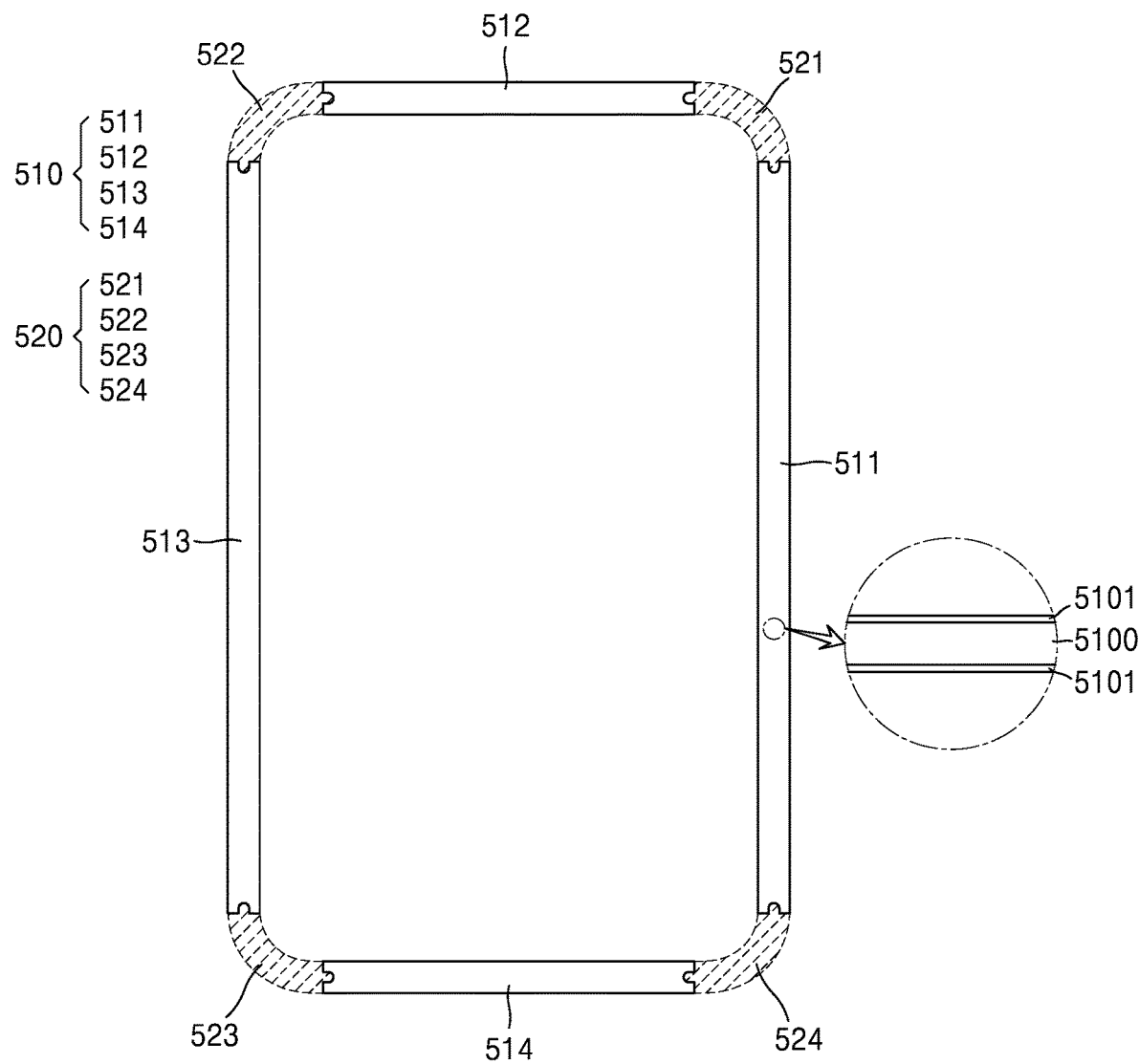
FIG. 3B is a schematic diagram of a first adhesive portion and a second adhesive portion, according to an embodiment of the disclosure.

FIG. 3B is a schematic diagram of a first adhesive portion and a second adhesive portion according to an embodiment of the disclosure.

Figure 4:
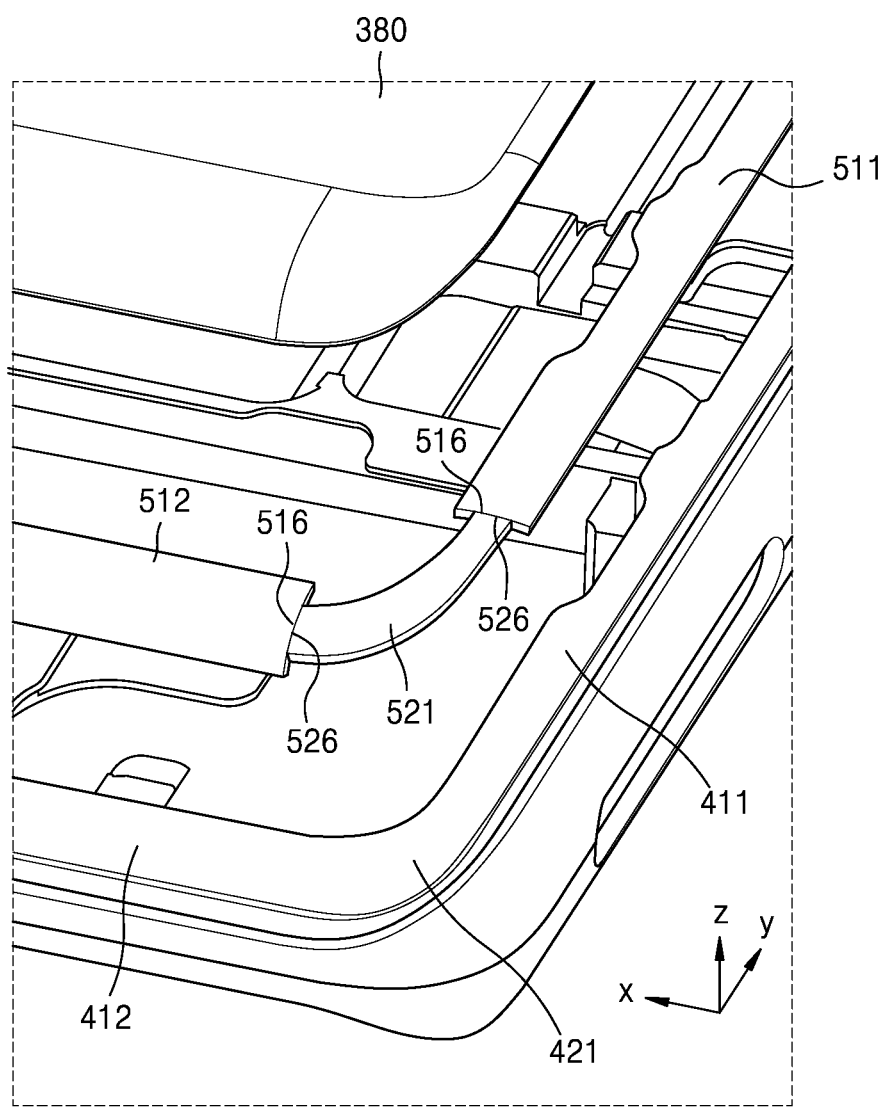
FIG. 4 is a separated perspective view of an edge portion of an electronic device according to an embodiment of the disclosure.

FIG. 4 is a separated perspective view of an edge portion of an electronic device according to an embodiment of the disclosure.

Referring to FIG. 3A, the first housing 310 and the second housing 380 of an electronic device according to an embodiment may include a first perimeter portion 410 and a second perimeter portion 420 which have different curvatures from each other. The first perimeter portion 410 and the second perimeter portion 420 according to an embodiment may include a sidewall of the first housing 310 and the second housing 380 or a part thereof. For example, there may be a plurality of first perimeter portions 410. For example, the first perimeter portion 410 may include 1-1 perimeter portion 411, 1-2 perimeter portion 412, 1-3 perimeter portion 413 and 1-4 perimeter portion 414 respectively arranged on two lateral sides, an upper portion, and a lower portion. For example, the 1-1 perimeter portion 411 to the 1-4 perimeter portion 414 may have a 3D curved structure bent and seamlessly extending in a direction (Z direction) perpendicular to a plane (XY plane) from a rear surface 381 of the second housing 380.

Figure 7A:
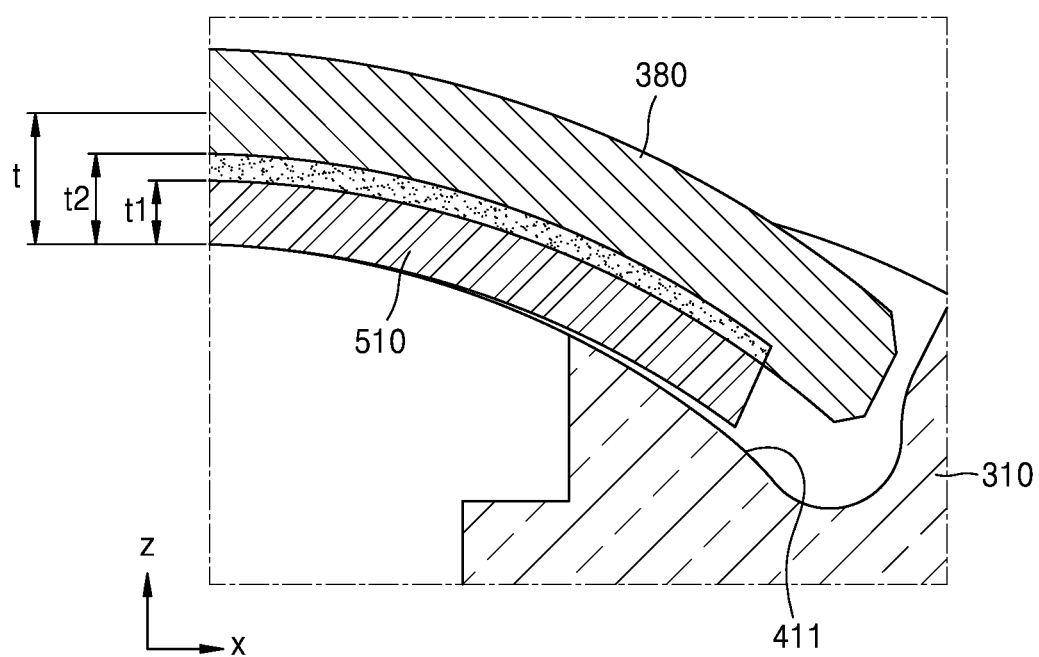
FIG. 7A is a cross-sectional view of a side portion of the electronic device of FIG. 1B taken along a line A-A in FIG. 1B, according to an embodiment of the disclosure.

As illustrated in FIG. 7A, the 1-1 perimeter portion 411 may have a 3D curved structure bent and seamlessly extending towards the front plate 320. Also, the first perimeter portion 410 extending along upper, lower, and lateral sides of the electronic device according to an embodiment may extend to have a first curvature along a plane (XY plane).

For example, when the first perimeter portion 410 is extended rectilinearly as illustrated in FIG. 3A, the first curvature may be 0.

For example, there may be a plurality of second perimeter portions 420. For example, the second perimeter portion 420 may include 2-1 perimeter portion 421 to 2-4 perimeter portion 424 respectively arranged at four edges. The 2-1 perimeter portion 421 to the 2-4 perimeter portion 424 may respectively be arranged between the 1-1 perimeter portion 411 to the 1-4 perimeter portion 414. For example, the 2-1 perimeter portion 421, 2-2 perimeter portion 422, 2-3 perimeter portion 423 and the 2-4 perimeter portion 424 may also have a 3D curved structure bent and seamlessly extending in a direction (Z direction) perpendicular to a plane (XY plane) from a rear surface 381 of the second housing 380.

Figure 7B:
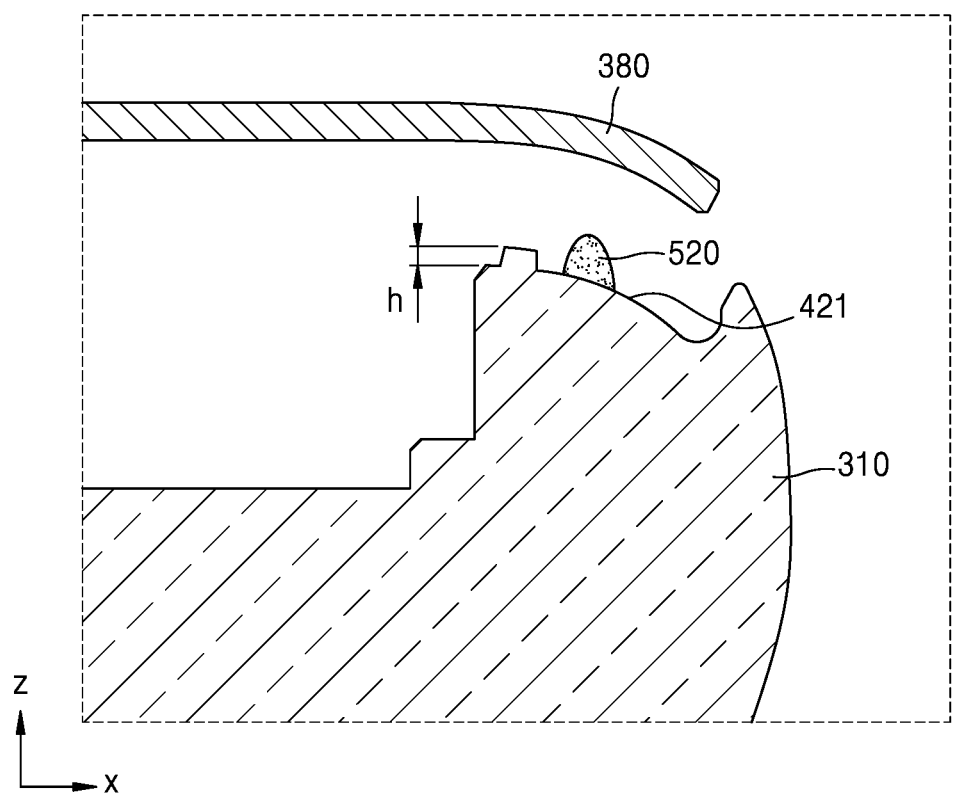
FIG. 7B is a cross-sectional view of an edge portion of the electronic device of FIG. 1B taken along a line B-B in FIG. 1B, according to an embodiment of the disclosure.

Referring to FIG. 7B, the 2-1 perimeter portion 421 may have a 3D curved structure bent and seamlessly extending towards the front plate 320. Also, the 2-1 perimeter portion 421 to the 2-4 perimeter portion 424 may respectively have a second curvature to connect an upper portion and a lateral portion of the electronic device. The second curvature of the second perimeter portion 420 according to an embodiment may exceed the first curvature of the first perimeter portion 410. For example, the 2-1 perimeter portion 421 may have a curved structure along a plane (XY plane), and accordingly, may have a certain first radius of curvature $d_1$. On the contrary, the 1-1 perimeter portion 411 may have a curved structure extending rectilinearly, and accordingly, may have an infinite second radius of curvature $d_2$ (not shown) along a plane (XY plane). Thus, the second curvature of the 2-1 perimeter portion 421 may exceed the first curvature of the first perimeter portion 410.

Accordingly, as described above, while the 1-1 perimeter portion 411 may have a curved structure bent and seamlessly extending rectilinearly towards the front plate 320, the 2-1 perimeter portion 421 may have a curved structure bent and extending seamlessly towards the front plate 320 and have the second curvature along the XY plane, and thus, the 2-1 perimeter portion 421 may substantially have a shape of a part of a sphere.

Although it is described that, in the foregoing embodiment, the 2-1 perimeter portion 421 may have a shape of a part of a sphere, and the 1-1 perimeter portion 411 may have a curved structure extending rectilinearly, the disclosure is not limited thereto. For example, the 2-1 perimeter portion 421 and the 1-1 perimeter portion 411 may have a curved structure having one or more curvatures. In such a case, the curvature may refer to an average curvature of a curve extending between both ends of the perimeter portion. Accordingly, when a first curve and a second curve having different curvatures are connected to each other between the both ends of the perimeter portion according to an embodiment, an average value of the curvatures of the first curve and the second curve may be determined as a curvature of the perimeter portion.

Referring to FIGS. 3A, 3B, and 4, the first adhesive portion 510 according to an embodiment may be arranged between the first housing 310 and the second housing 380 to combine the first housing 310 and the second housing 380. The first adhesive portion 510 according to an embodiment may be arranged along the first perimeter portion 410. For example, when the first perimeter portion 410 includes the 1-1 perimeter portion 411 to the 1-4 perimeter portion 414 respectively arranged on the four lateral sides, the first adhesive portion 510 may include a plurality of adhesive portions, for example, the 1-1 adhesive portion 511, 1-2 adhesive portion 512, 1-3 adhesive portion 513 and the 1-4 adhesive portion 514. The 1-1 adhesive portion 511 to the 1-4 adhesive portion 514 may be arranged apart from each other. For example, the first adhesive portion 510 may be an adhesive member having an adhesive support portion 5100 extending in one direction with a first adhesive material 5101 arranged on one side or both sides thereof. For example, the first adhesive portion 510 may be an optically clear adhesive tape (OCA tape); however, the disclosure is not limited thereto.

For example, as illustrated in FIG. 4, the 1-1 adhesive portion 511 and the 1-2 adhesive portion 512 may be an adhesive member extending in one direction. At this time, the 1-1 adhesive portion 511 and the 1-2 adhesive portion 512 may be arranged apart from each other along the 1-1 perimeter portion 411 and the 1-2 perimeter portion 412. When the 1-1 adhesive portion 511 and the 1-2 adhesive portion 512 extend along the 2-1 perimeter portion 421, and the 1-1 adhesive portion 511 and the 1-2 adhesive portion 512 are formed in an integrated matter, due to the shape of the 2-1 perimeter portion 421, the 1-1 adhesive portion 511 and the 1-2 adhesive portion 512 may be rimpled. For example, when the 1-1 adhesive portion 511 and the 1-2 adhesive portion 512 are provided as a double-sided adhesive tape extending in one direction, in the area of the 2-1 perimeter portion 421, wrinkles may be generated at the 1-1 adhesive portion 511 and the 1-2 adhesive portion 512. The first adhesive portion 510 arranged between the first housing 310 and the second housing 380 may not only be used as an adhesive member combining the first housing 310 and the second housing 380 but also perform the water and dust proof function to prevent moisture, dust, etc. from flowing into the first housing 310 from the outside. Accordingly, when deformation, e.g., wrinkles, occurs at the first adhesive portion 510, not only the adhesion between the first housing 310 and the second housing 380 may decrease, but also the water and dust proof function may be deteriorated.

The second adhesive portion 520 according to an embodiment may be arranged between the first housing 310 and the second housing 380 to combine the first housing 310 and the second housing 380. The second adhesive portion 520 according to an embodiment may be arranged along the second perimeter portion 420. For example, when the first adhesive portion 510 includes multiple adhesive portions, for example, the 1-1 adhesive portion 511 to the 1-4 adhesive portion 514, the second adhesive portion 520 may include a 2-1 adhesive portion 521, 2-2 adhesive portion 522, 2-3 adhesive portion 523 and a 2-4 adhesive portion 524 arranged between the 1-1 adhesive portion 511 to the 1-4 adhesive portion 514.

For example, the second adhesive portion 520 may include a material having an elasticity higher than that of the first adhesive portion 510 or a material having a strain higher than that of the first adhesive portion 510. In this specification, the elasticity and strain may include tension or compression rate by the pressure at the time when the second adhesive portion 520 is arranged at the second perimeter portion 420 before the second adhesive portion 520 is hardened. For example, when the first adhesive portion 510 is an adhesive tape with the first adhesive material 5101 arranged on one side or both sides of the adhesive support portion 5100 thereof extending in one direction, the second adhesive portion 520 may be provided in the form of fluid and arranged along the shape of the second perimeter portion 420. For example, the second adhesive portion 520 may be a water-curable, thermosetting, or photocurable second adhesive material. The second adhesive portion 520 may have an unspecified shape; however, when pressure is applied to the second adhesive portion 520 to combine the first housing 310 and the second housing 380, the second adhesive portion 520 may flow to be arranged along the shape of the second perimeter portion 420. Accordingly, the second adhesive portion 520 may have a 3D shape corresponding to the shape of the second perimeter portion 420. When the first adhesive portion 510 including the adhesive support portion 5100 extending in one direction is arranged along the second perimeter portion 420, the first adhesive portion 510 may be deformed and creased, and thus may not fill a gap between the first housing 310 and the second housing 380.

The embodiment of the disclosure described above describes that the first adhesive portion 510 is an adhesive tape with the first adhesive material 5101 arranged at one side or both sides of the adhesive support portion 5100 thereof extending in one direction, but the disclosure is not limited thereto. For example, the first adhesive portion 510 may also be an adhesive material having a relatively high elasticity and strain, for example, a water-curable, thermosetting, or photocurable adhesive material. Also, for example, the second adhesive portion 520 may be an OCA tape having an excellent elasticity, compared to the first adhesive portion 510, a thermosetting liquid adhesive material or photocurable liquid adhesive material having a high strain, or a combination thereof; however, the disclosure is not limited thereto.

As the second adhesive portion 520 having an excellent elasticity or strain, for example, the second adhesive portion 520 including a liquid adhesive material is arranged at the second perimeter portion 420 having a curvature higher than that of the first perimeter portion 410 having a curved structure extending rectilinearly, for example, the second perimeter portion 420 having a shape of a part of a sphere, the second adhesive portion 520 may be deformed or elongated in correspondence with the shape of the second perimeter portion 420. As the second adhesive portion 520 is deformed or elongated to correspond to the shape of the second perimeter portion 420, the second adhesive portion 520 may be arranged between the first housing 310 and the second housing 380 at the second perimeter portion 420 having a partial sphere shape such that no space exists between the first housing 310 and the second housing 380. Accordingly, the second adhesive portion 520 may combine the first housing 310 and the second housing 380 along the shape of the second perimeter portion 420 having a partially spherical shape. Also, the second adhesive portion 520 may easily perform the water and dust proof function to prevent outside moisture, dust, etc. from flowing into the first housing 310.

Figure 5A:
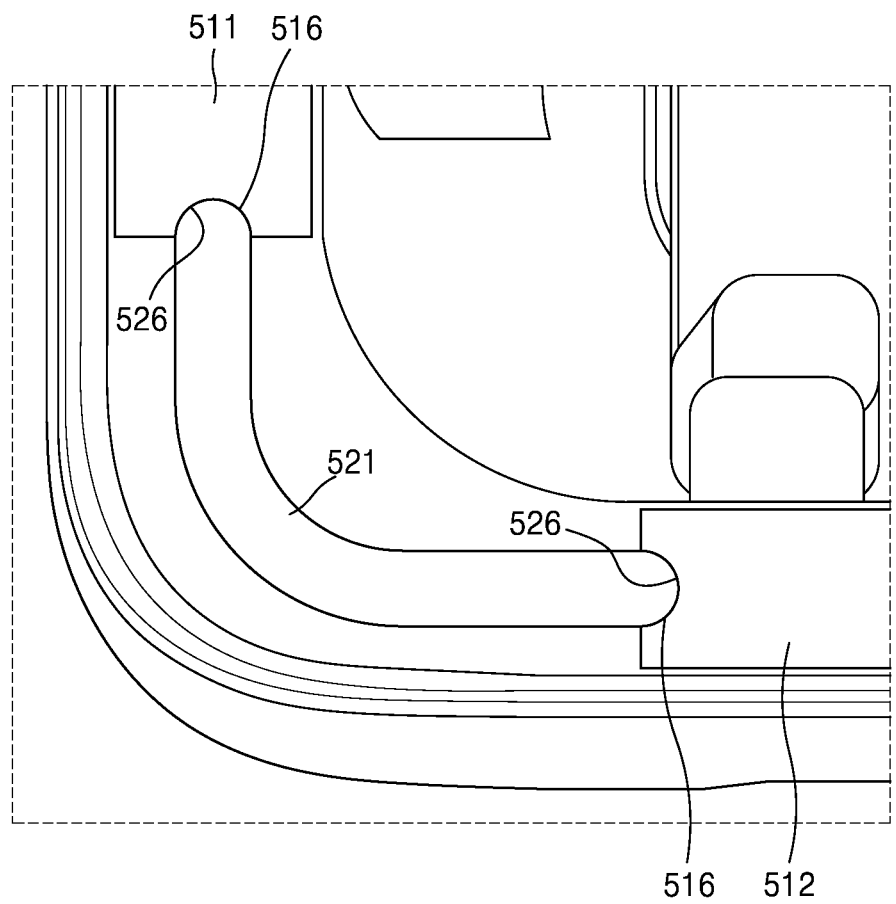
FIG. 5A is a perspective view of an edge portion of an electronic device according to an embodiment of the disclosure.

FIG. 5A is a perspective view of an edge portion of an electronic device according to an embodiment.

Figure 5B:
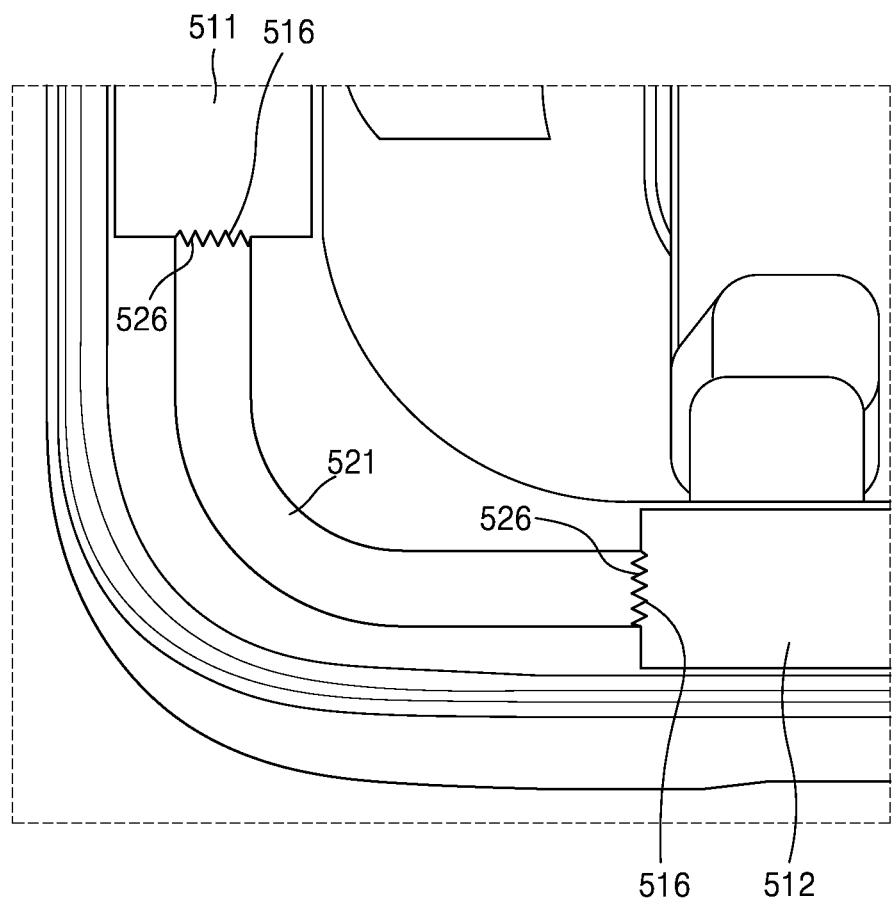
FIG. 5B is a separated perspective view of an edge portion of an electronic device according to an embodiment of the disclosure.

FIG. 5B is a separated perspective view of an edge portion of an electronic device according to another embodiment.

As illustrated in FIG. 4, when the 2-1 adhesive portion 521 is arranged between the 1-1 adhesive portion 511 and the 1-2 adhesive portion 512, and the 1-1 adhesive portion 511 and the 1-2 adhesive portion 512 are connected by using the 2-1 adhesive portion 521, a boundary area between a joint portion between the 1-1 adhesive portion 511 and the 2-1 adhesive portion 521 and a joint portion between the 1-2 adhesive portion 512 and the 2-1 adhesive portion 521 may be formed.

Referring to FIGS. 5A and 5B, the first adhesive portion 510 according to an embodiment may include a first joint portion 516 at both ends, and the second adhesive portion 520 may include a second joint portion 526 facing the first joint portion 516 at both ends. For example, when the 2-1 adhesive portion 521 is arranged between the 1-1 adhesive portion 511 and the 1-2 adhesive portion 512, the first joint portion 516 may be arranged at one end of the 1-1 adhesive portion 511, and the second joint portion 526 may be arranged at one end of the 2-1 adhesive portion 521.

As described above, the first joint portion 516 and the second joint portion 526 may face each other, and accordingly, a joint area may be formed between the first joint portion 516 and the second joint portion 526. To extend the joint area described above, the shapes of the first joint portion 516 and the second joint portion 526 may be changed. For example, as illustrated in FIG. 5A, the first joint portion 516 arranged at one end of the 1-1 adhesive portion 511 may have a grooved shape, and the second joint portion 526 arranged at one end of the 2-1 adhesive portion 521 may have a protruding shape corresponding to the grooved shape. In such a case, a joint area relatively further extending than the joint area provided in a linear form between the first joint portion 516 and the second joint portion 526 as illustrated in FIG. 4 may be secured. Accordingly, a travel path of moisture or foreign substances which may flow in between the first joint portion 516 and the second joint portion 526 may be extended to prevent the inflow of such moisture and foreign substances.

The shape of the first joint portion 516 and the second joint portion 526 according to an embodiment is not limited to the grooved shape or protruding shape. For example, as illustrated in FIG. 5B, the first joint portion 516 and the second joint portion 526 may be formed in zigzags in correspondence with each other. Also, although it is not shown in the drawings, the first joint portion 516 and the second joint portion 526 may be provided in arbitrary shapes corresponding to each other to extend a length of the joint area. However, the disclosure is not limited thereto, and when the 2-1 adhesive portion 521 includes a liquid second adhesive material, the second joint portion 526 may be spaced apart from the first joint portion 516 at a certain distance or arranged to overlap the grooved portion.

Figure 6:
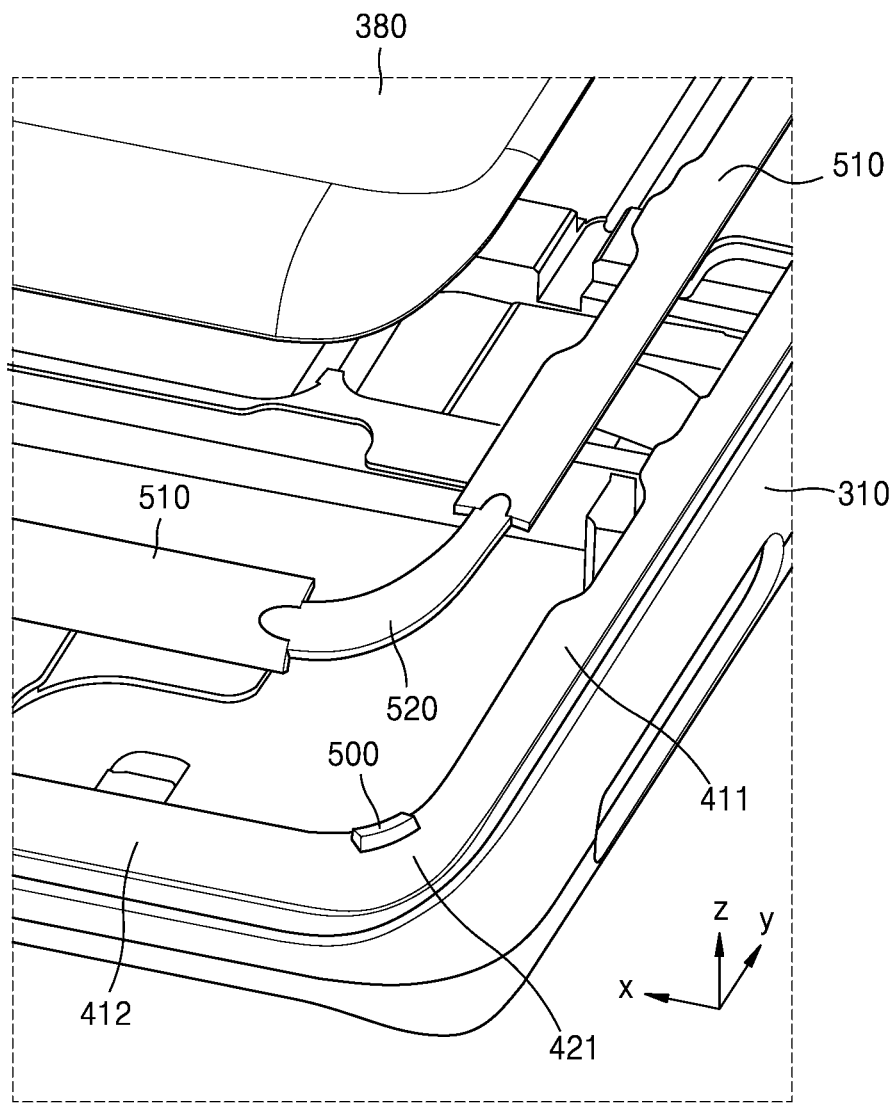
FIG. 6 is a perspective view of an edge portion of an electronic device according to an embodiment of the disclosure.

FIG. 6 is a perspective view of an edge portion of an electronic device according to an embodiment of the disclosure.

FIG. 7A is a cross-sectional view of a side portion of the electronic device of FIG. 1B taken along a line A-A in FIG. 1B, according to an embodiment of the disclosure.

FIG. 7B is a cross-sectional view of an edge portion of the electronic device of FIG. 1B taken along a line B-B in FIG. 1B, according to an embodiment of the disclosure.

Referring to FIG. 6, to combine the first housing 310 and the second housing 380 according to an embodiment, the first adhesive portion 510 and the second adhesive portion 520 may be arranged between the first housing 310 and the second housing 380, and downward pressure may be applied thereon in the thickness direction (Z direction). At this time, the first adhesive portion 510 and the second adhesive portion 520 may include different materials, and thus may have different degrees of compression by compressive force and reexpansion due to elastic force after the compressive force is removed. When the first adhesive portion 510 and the second adhesive portion 520 have different degrees of compression and reexpansion, a distance between the first housing 310 and the second housing 380 may vary, and accordingly, due to such an error in distance, moisture and foreign substances may permeate from outside.

The protruding support portion 500 according to an embodiment may have a certain thickness h in the thickness direction (Z direction) of the electronic device. For example, the protruding support portion 500 may be arranged on one side of the first housing 310, and as an upper surface supports a lower surface of the second housing 380, the degree of compression of the first adhesive portion 510 and the second adhesive portion 520 may be limited within a certain range.

For example, the protruding support portion 500 may be arranged at the second perimeter portion 420. Also, the protruding support portion 500 may be arranged in an arbitrary position apart from the second adhesive portion 520. For example, the protruding support portion 500 may be arranged at the 2-1 perimeter portion 421, and at this time, the protruding support portion 500 may be arranged on an inner side spaced apart from the 2-1 adhesive portion 521. The protruding support portion 500 may be integrated with the first housing 310 or may be provided as a separate component.

Referring to FIG. 7A, when the first adhesive portion 510 is provided as an adhesive tape having a certain thickness t with no pressure applied thereon, the first adhesive portion 510 may be compressed to have a first thickness $t_1$ by the downward pressure of the second housing 380. When the downward pressure by the second housing 380 is removed, the first adhesive portion 510 may be expanded to have a second thickness $t_2$. At this time, when the second adhesive portion 520 is provided as a curable second adhesive material, and the protruding support portion 500 is not arranged, the second adhesive portion 520 having a high strain may be compressed to have the first thickness t1 and then hardened without reexpansion, or an air pocket may be formed by the second adhesive portion 520. Accordingly, an error between the thicknesses of the first adhesive portion 510 and the second adhesive portion 520 may occur.

Referring to FIG. 7B, the protruding support portion 500 may have a certain thickness h in the thickness direction (Z direction) of the electronic device. As described above, in the process of combining the first housing 310 and the second housing 380, the first adhesive portion 510 may be compressed and reexpanded. At this time, as a thickness of the first adhesive portion 510 may change, the protruding support portion 500 may be arranged to limit the compression degree of the first adhesive portion 510 and the second adhesive portion 520. Here, the thickness h of the protruding support portion 500 according to an embodiment of the disclosure may be greater than or equal to 50% of the thickness t of the first adhesive portion 510. As described above, as the protruding support portion 500 is arranged, errors due to a thickness difference between the first adhesive portion 510 and the second adhesive portion 520 may be prevented. Moreover, the inflow of the moisture and foreign substances due to the errors according to the thickness difference between the first adhesive portion 510 and the second adhesive portion 520 may be prevented.

Figure 8:
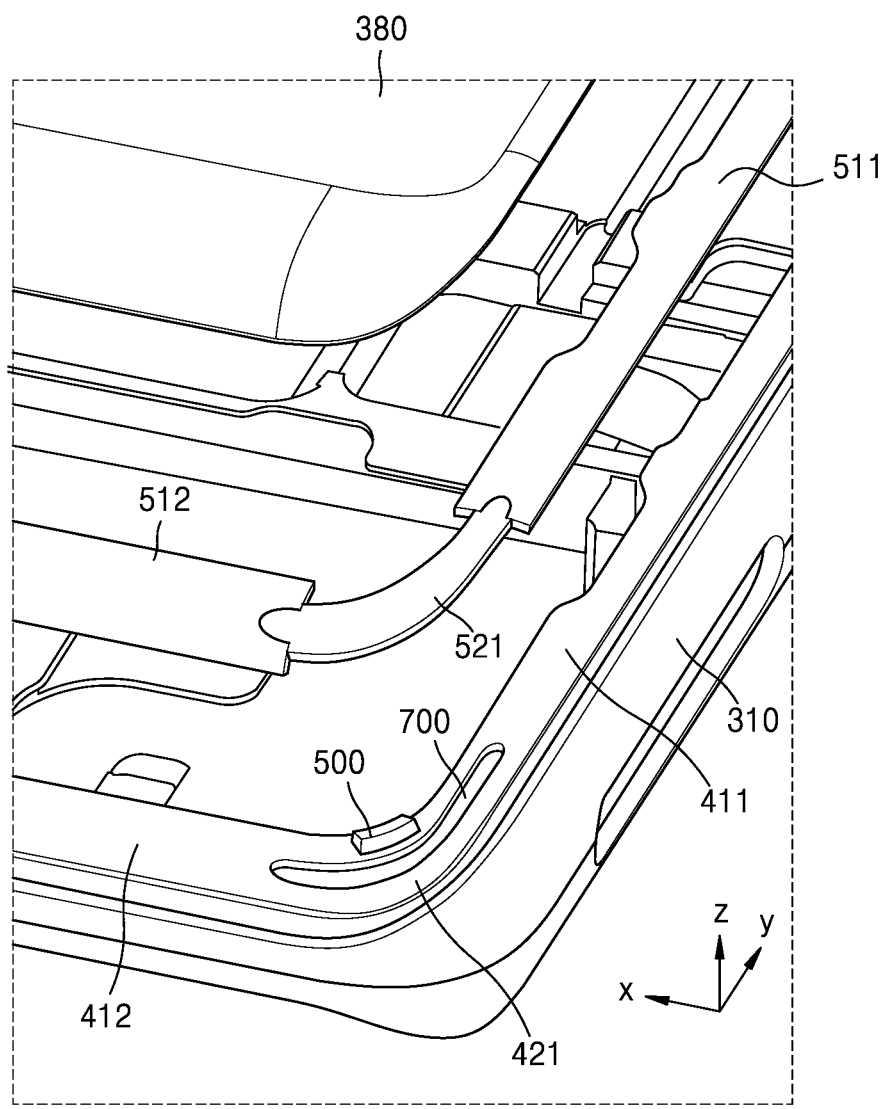
FIG. 8 is a perspective view of an edge portion of an electronic device according to an embodiment of the disclosure.

FIG. 8 is a perspective view of an edge portion of an electronic device according to an embodiment of the disclosure.

Figure 9A:
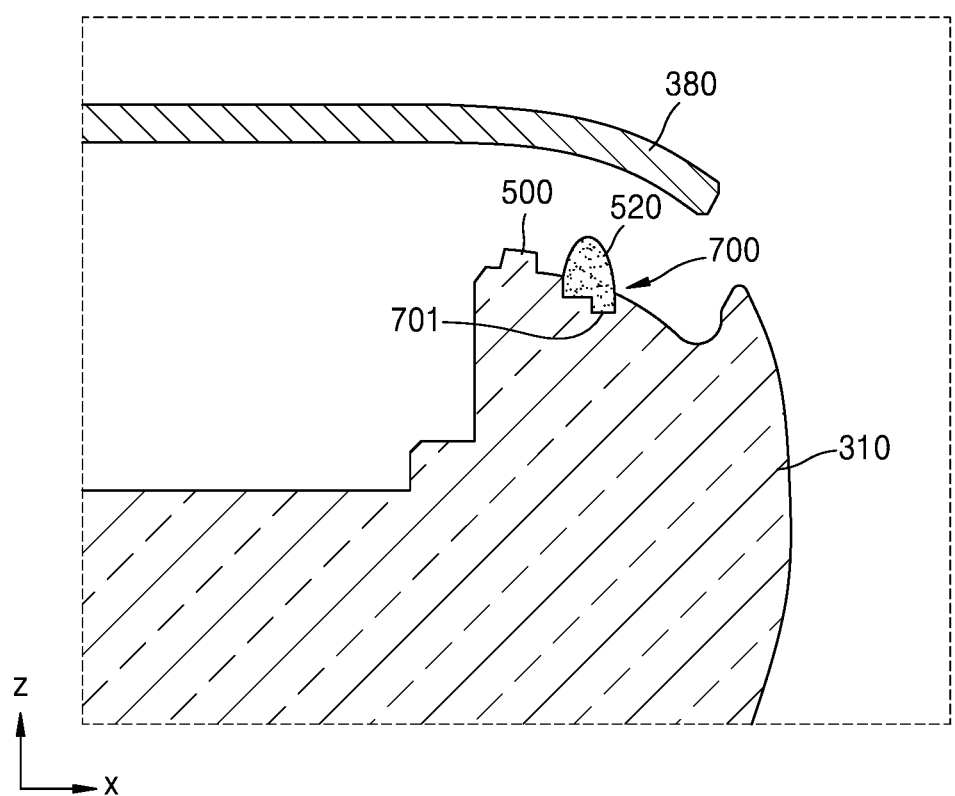
FIG. 9A is a cross-sectional view of an edge portion of an electronic device according to an embodiment of the disclosure.

FIG. 9A is a cross-sectional view of an edge portion of an electronic device according to an embodiment of the disclosure.

Figure 9B:
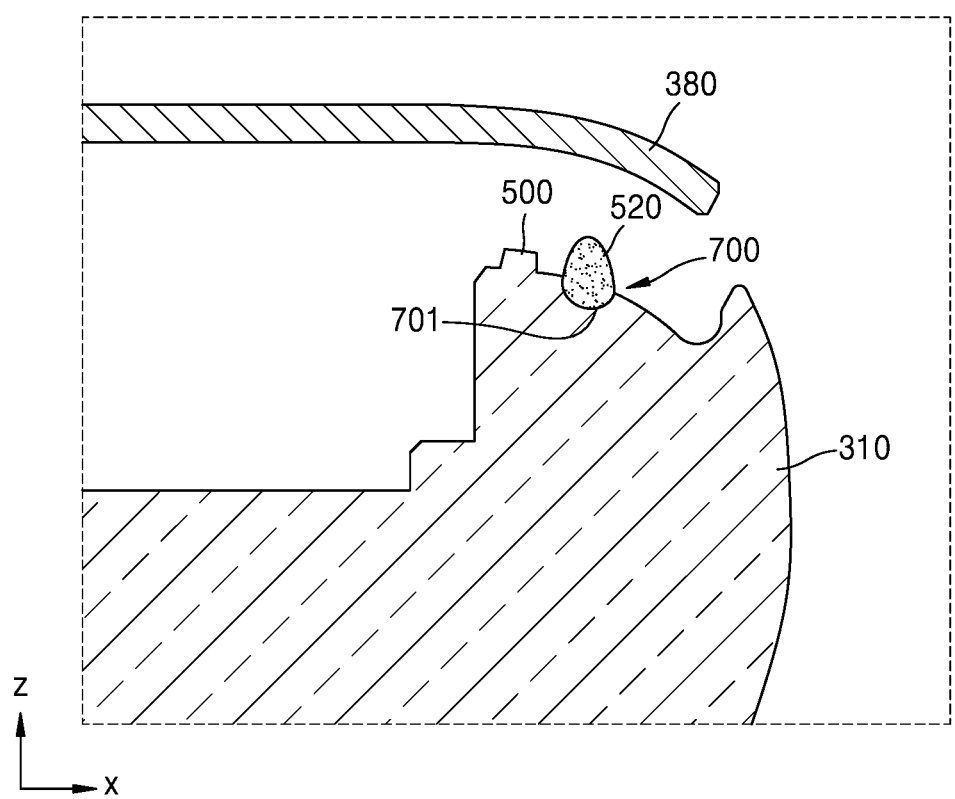
FIG. 9B is a cross-sectional view of an edge portion of an electronic device according to an embodiment of the disclosure.

FIG. 9B is a cross-sectional view of an edge portion of an electronic device according to another embodiment of the disclosure.

As illustrated in FIG. 4, when the 2-1 adhesive portion 521 is arranged along the 2-1 perimeter portion 421 having a curved surface, and the 2-1 adhesive portion 521 includes a curable liquid as a second adhesive material, the 2-1 adhesive portion 521 may flow off the 2-1 perimeter portion 421. Accordingly, when the pressure is applied on the 2-1 adhesive portion 521 arranged between the first housing 310 and the second housing 380 to combine the first housing 310 and the second housing 380, the 2-1 adhesive portion 521 may be exposed to the outside of the first housing 310 and the second housing 380. Accordingly, a support portion capable of supporting the second adhesive portion 520, which has a higher elasticity and strain than the first adhesive portion 510, may be required.

Referring to FIG. 8, an adhesive portion accommodating portion 700 according to an embodiment may be recessed downwards in the thickness direction (Z direction) of the electronic device to accommodate a part of the second adhesive portion 520. For example, the adhesive portion accommodating portion 700 may be provided in a grooved shape extending along the 2-1 perimeter portion 421. At this time, the 2-1 adhesive portion 521 may be arranged to be received in the adhesive portion accommodating portion 700. There may be a single adhesive portion accommodating portion 700 or a plurality of adhesive portion accommodating portions 700. This is further described later with reference to FIG. 13.

According to an embodiment, a volume of the second adhesive portion 520 arranged at the second perimeter portion 420 may vary. To accommodate the second adhesive portions 520 having different volumes, the shape of the adhesive portion accommodating portion 700 may vary.

Referring to FIG. 9A, a lower surface 701 of the adhesive portion accommodating portion 700 may have a stepped portion. Accordingly, the second adhesive portion 520 of relatively greater volume may be accommodated in comparison with a case where the lower surface 701 is flat.

Referring to FIG. 9B, the lower surface 701 of the adhesive portion accommodating portion 700 may have a recessed and curved portion. Accordingly, the second adhesive portion 520 of relatively greater volume may be accommodated in comparison with a case where the lower surface 701 is flat. Also, when the lower surface 701 of the adhesive portion accommodating portion 700 has a recessed and curved portion, the second adhesive portion 520 including a liquid second adhesive material may not flow down on the second perimeter portion 420. However, the disclosure is not limited thereto, and the lower surface 701 may have various shapes, including a curved portion, etc.

Figure 10:
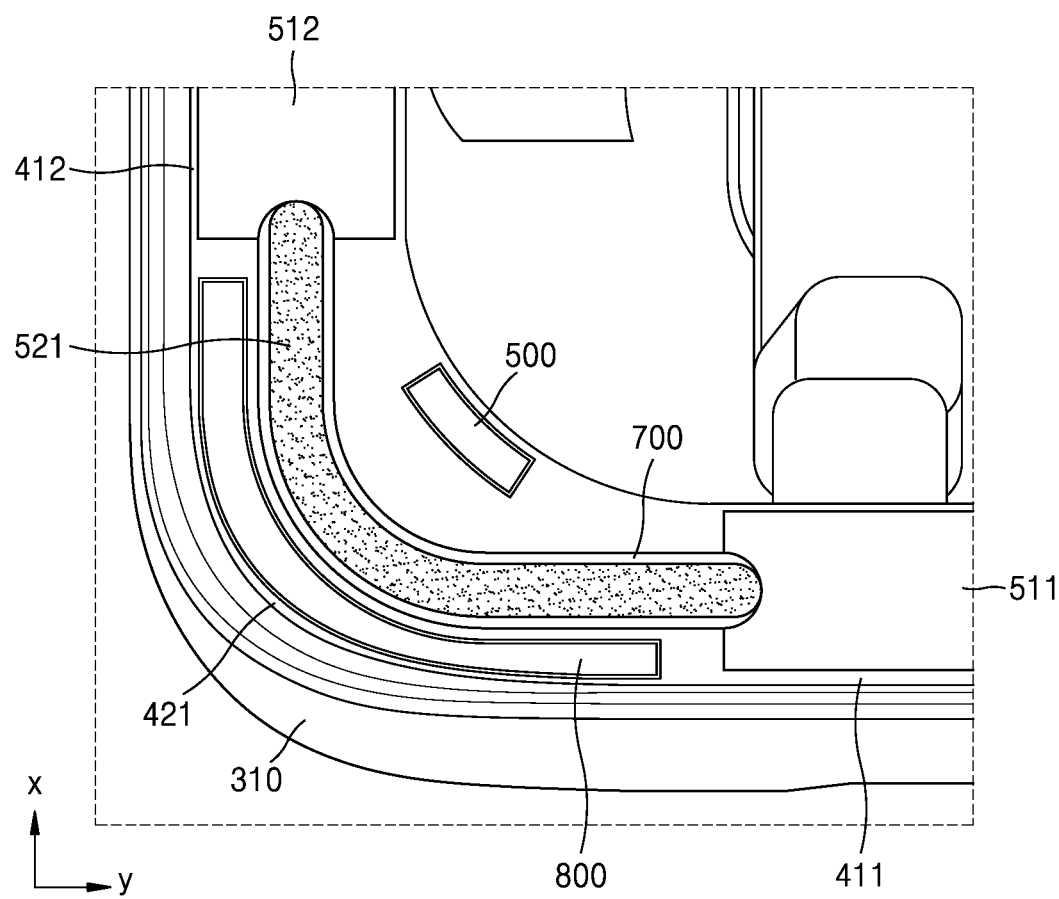
FIG. 10 is a perspective view of an edge portion of an electronic device according to an embodiment of the disclosure.

FIG. 10 is a perspective view of an edge portion of an electronic device according to another embodiment of the disclosure.

Figure 11:
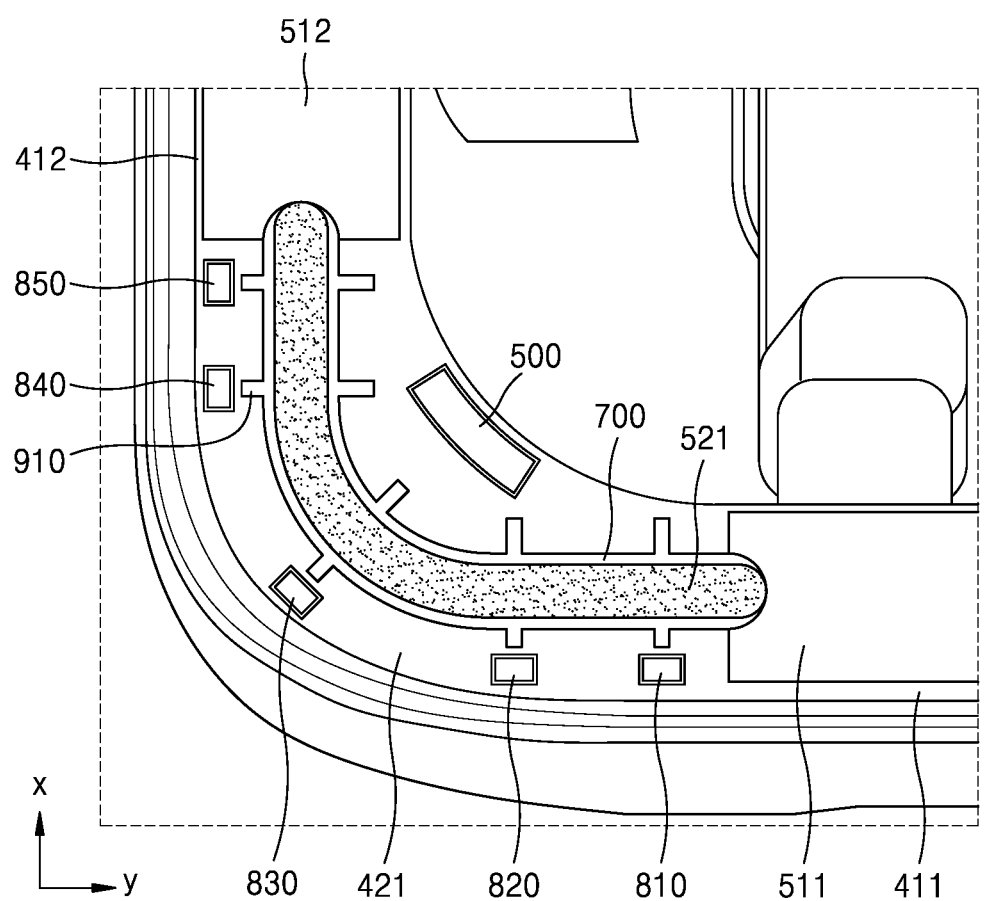
FIG. 11 is a perspective view of an edge portion of an electronic device according to an embodiment of the disclosure.

FIG. 11 is a perspective view of an edge portion of an electronic device according to another embodiment of the disclosure.

As illustrated in FIG. 8, only a part of the second adhesive portion 520 according to an embodiment of the disclosure may be accommodated in the adhesive portion accommodating portion 700. Accordingly, the rest of the second adhesive portion 520 which is not accommodated in the adhesive portion accommodating portion 700 may be attached to the second housing 380. However, in a process of applying pressure on the second adhesive portion 520 to attach the first housing 310 and the second housing 380, the second adhesive portion 520 may be taken out.

Referring to FIG. 10, an adhesive portion support portion 800 according to an embodiment may protrude upwards in the thickness direction (Z direction) of the electronic device to prevent the second adhesive portion 520 from leaving the first housing 310. For example, the adhesive portion support portion 800 may be provided in a protruding shape extending along the 2-1 perimeter portion 421. At this time, to attach the first housing 310 and the second housing 380, pressure may be applied in the thickness direction (Z direction) of the electronic device on a part of the 2-1 adhesive portion 521, which is not accommodated in the adhesive portion accommodating portion 700. For example, the 2-1 adhesive portion 521 may be a fluid having a relatively high strain, for example, a curable second adhesive material. When the pressure is applied to the 2-1 adhesive portion 521 in the thickness direction (Z direction) of the electronic device, the 2-1 adhesive portion 521 may leave the first housing 310. The adhesive portion support portion 800 may be provided in the protruding shape extending along the 2-1 perimeter portion 421 and arranged in an outer area of the first housing 310. Accordingly, the 2-1 adhesive portion 521 may be supported by the adhesive portion support portion 800, and the 2-1 adhesive portion 521 may be prevented from being exposed to the outer area of the first housing 310. However, the disclosure is not limited thereto, and the adhesive portion support portion 800 may be arranged in an inner direction from the first housing 310 with respect to the 2-1 adhesive portion 521. Also, there may be a single adhesive portion support portion 800 or a plurality of adhesive portion support portions 800.

Referring to FIG. 11, there may be a plurality of adhesive portion support portions 800, and the plurality of adhesive portion support portions 800 may be spaced apart from each other along the 2-1 perimeter portion 421. For example, the adhesive portion support portion 800 may include a first adhesive portion support portion 810, a second adhesive portion support portion 820, a third adhesive portion support portion 830, a fourth adhesive portion support portion 840 and a fifth adhesive portion support portion 850 protruding upwards in the thickness direction (Z direction) of the electronic device. The first adhesive portion support portion 810 to the fifth adhesive portion support portion 850 may be spaced apart from each other at a certain distance along the 2-1 perimeter portion 421 to prevent the 2-1 adhesive portion 521 from leaving the first housing 310. When a flow path of the 2-1 adhesive portion 521 is specified, the plurality of adhesive portion support portions 800 may be provided, as described above, to efficiently prevent the 2-1 adhesive portion 521 from leaving the first housing 310.

For example, a first adhesive portion channel 910 may extend from the adhesive portion accommodating portion 700 and have a grooved shape recessed downwards in the thickness direction (Z direction) of the electronic device. For example, the 2-1 adhesive portion 521 received in the adhesive portion accommodating portion 700 may receive pressure in the thickness direction (Z direction) of the electronic device and leave the adhesive portion accommodating portion 700. At this time, the first adhesive portion channel 910 may serve as a movement guide and an additional adhesive portion accommodating portion for the 2-1 adhesive portion 521, and the first adhesive portion support portion 810 to the fifth adhesive portion support portion 850 may be arranged at one end of the first adhesive portion channel 910 to limit the movement of the 2-1 adhesive portion 521 to the outside of the first adhesive portion channel 910. An adhesive portion channel performing the function of movement guide and additional adhesive portion accommodating portion for the second adhesive portion 520 may be arranged apart from the adhesive portion accommodating portion 700.

Figure 12:
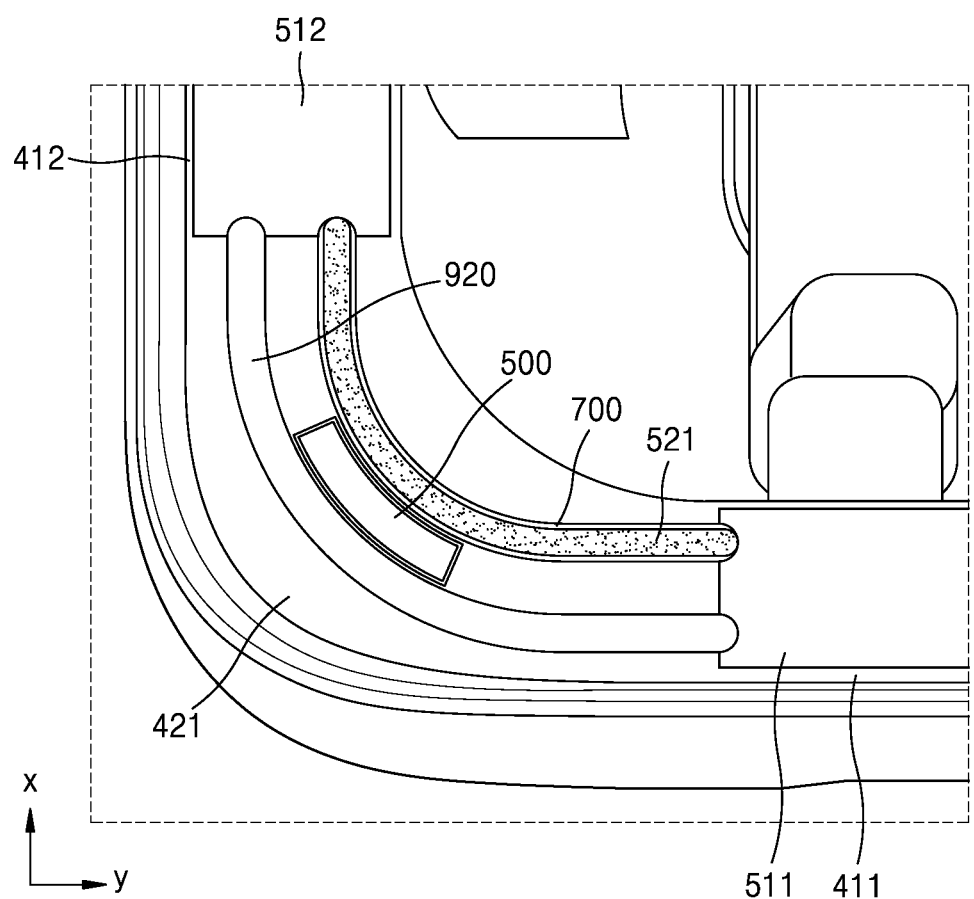
FIG. 12 is a perspective view of an edge portion of an electronic device according to an embodiment of the disclosure.

FIG. 12 is a perspective view of an edge portion of an electronic device according to an embodiment of the disclosure.

Figure 13:
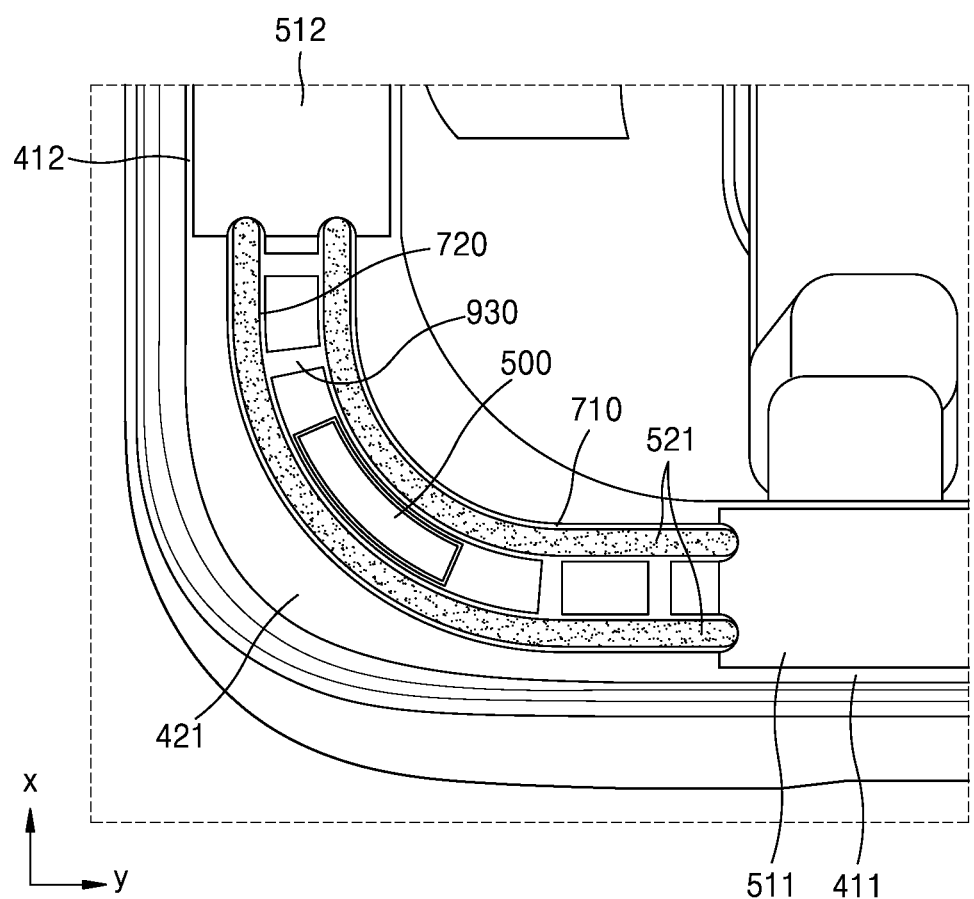
FIG. 13 is a perspective view of an edge portion of an electronic device according to an embodiment of the disclosure.

FIG. 13 is a perspective view of an edge portion of an electronic device according to an embodiment of the disclosure.

Referring to FIG. 12, a second adhesive portion channel 920 may have a grooved shape recessed downwards in the thickness direction (Z direction) of the electronic device apart from the adhesive portion accommodating portion 700. At this time, the second adhesive portion channel 920 may extend along the 2-1 perimeter portion 421, having a certain distance from the adhesive portion accommodating portion 700. For example, the 2-1 adhesive portion 521 received in the adhesive portion accommodating portion 700 may receive pressure in the thickness direction (Z direction) of the electronic device and leave the adhesive portion accommodating portion 700. At this time, the second adhesive portion channel 920 may serve as an additional adhesive portion accommodating portion for the 2-1 adhesive portion 521. The protruding support portion 500 may be arranged between the adhesive portion accommodating portion 700 and the second adhesive portion channel 920. However, the disclosure is not limited thereto, and the protruding support portion 500 may be arranged outside or inside the adhesive portion accommodating portion 700 and the second adhesive portion channel 920. Also, although it is not shown in the drawings, the adhesive portion support portion 800 may be spaced apart from the second adhesive portion channel 920 to prevent the 2-1 adhesive portion 521 from being exposed to the outside of the first housing 310.

Referring to FIG. 13, there may be a plurality of adhesive portion accommodating portions 700 according to an embodiment. For example, the adhesive portion accommodating portion 700 may include a first adhesive portion accommodating portion 710 and a second adhesive portion accommodating portion 720. The first adhesive portion accommodating portion 710 and the second adhesive portion accommodating portion 720 may extend along the 2-1 perimeter portion 421. The protruding support portion 500 may be arranged between the first adhesive portion accommodating portion 710 and the second adhesive portion accommodating portion 720. However, the disclosure is not limited thereto, and the protruding support portion 500 may be arranged outside or inside the first adhesive portion accommodating portion 710 and the second adhesive portion accommodating portion 720.

A third adhesive portion channel 930 according to an embodiment may be arranged between the first adhesive portion accommodating portion 710 and the second adhesive portion accommodating portion 720. The third adhesive portion channel 930 may provide a travel path along which the 2-1 adhesive portion 521 moves between the first adhesive portion accommodating portion 710 and the second adhesive portion accommodating portion 720 or serve as an additional accommodating portion for additionally accommodating the 2-1 adhesive portion 521. According to an embodiment, there may be a single third adhesive portion channel 930 or a plurality of third adhesive portion channels 930 as illustrated in FIG. 13.

Figure 14A:
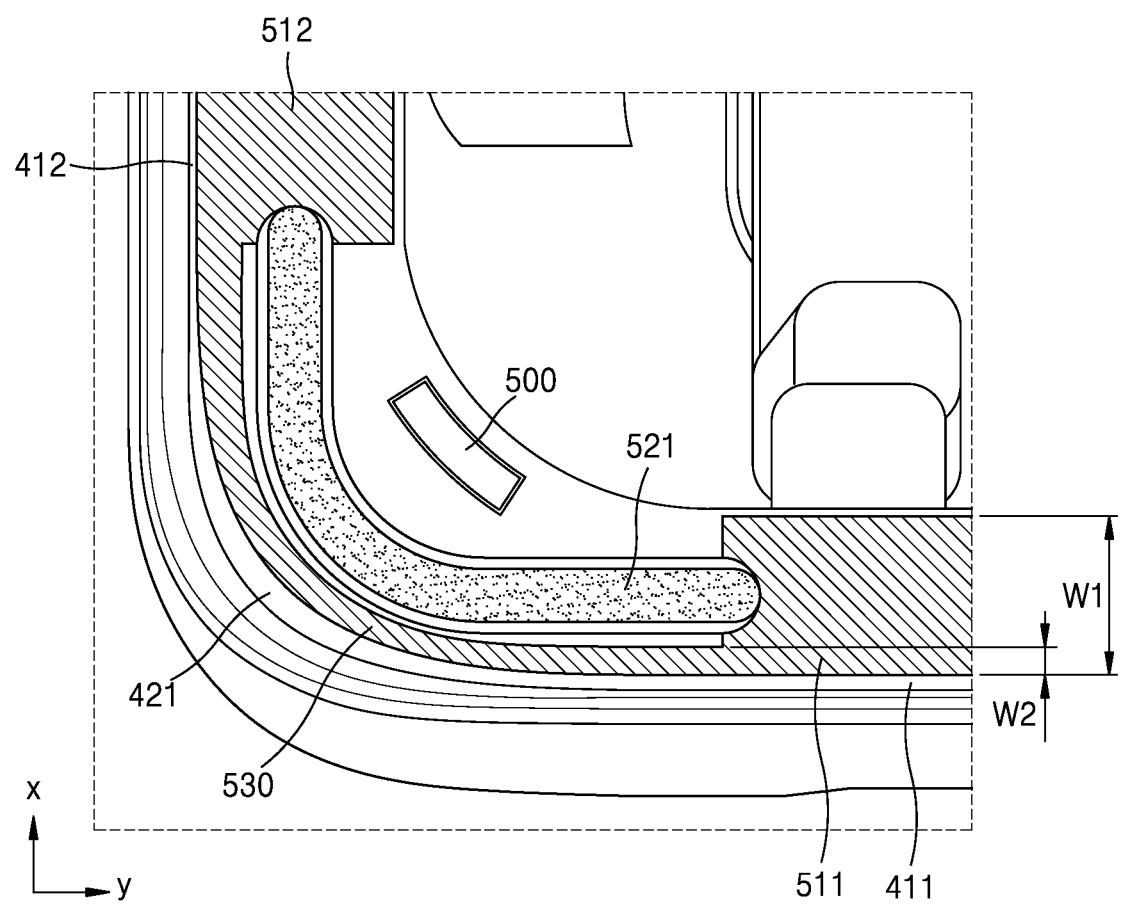
FIG. 14A is a perspective view of an edge portion of an electronic device according to an embodiment of the disclosure.

FIG. 14A is a perspective view of an edge portion of an electronic device according to an embodiment of the disclosure.

Figure 14B:
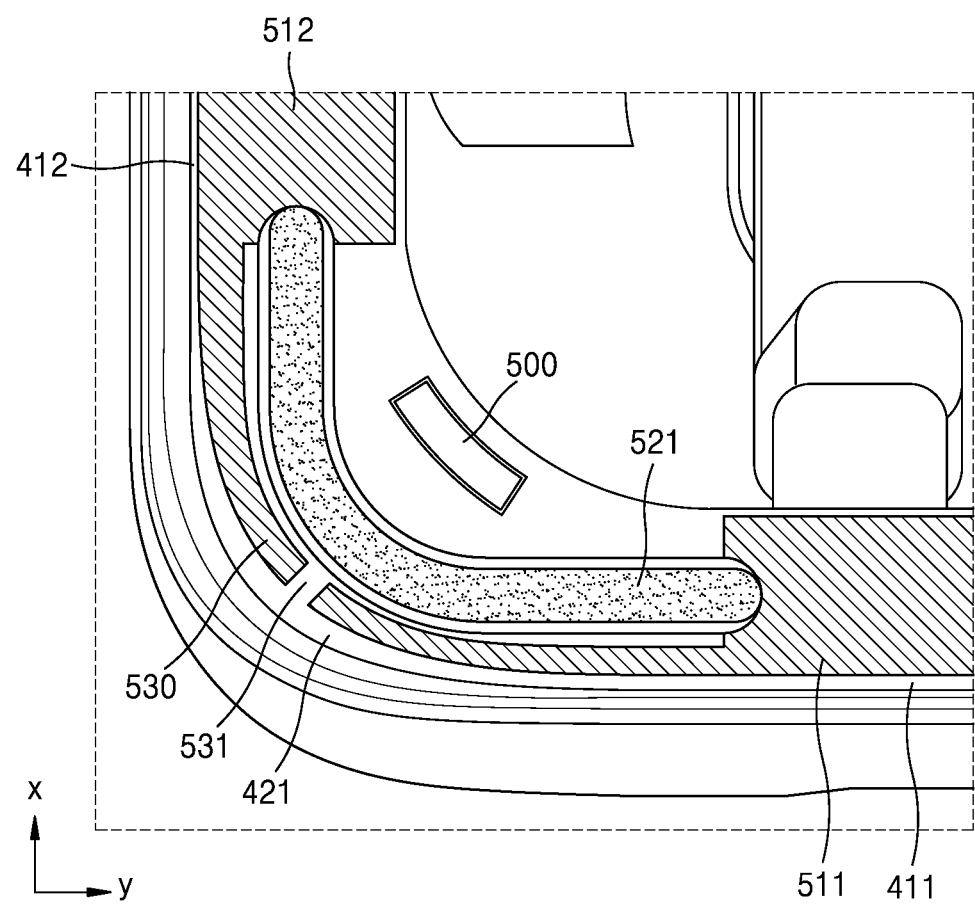
FIG. 14B is a perspective view of an edge portion of an electronic device according to an embodiment of the disclosure.

FIG. 14B is a perspective view of an edge portion of an electronic device according to an embodiment of the disclosure.

In the aforementioned embodiment, the protruding support portion 500 may be arranged to prevent the second adhesive portion 520 from leaving the first housing 310. However, as illustrated in FIG. 7A, the first adhesive portion 510 may have a certain thickness, and accordingly, the second adhesive portion 520 may also be prevented from leaving the first housing 310 by using the first adhesive portion 510.

Referring to FIG. 14A, a third adhesive portion 530 may be connected to the first adhesive portion 510, and have a width less than that of the first adhesive portion 510. For example, the third adhesive portion 530 may be integrated with the first adhesive portion 510. For example, the third adhesive portion 530 having a second width $W_2$ may be arranged between the 1-1 adhesive portion 511 and the 1-2 adhesive portion 512 having a first width $W_1$, and at this time, the 1-1 adhesive portion 511, the third adhesive portion 530, and the 1-2 adhesive portion 512 may be formed in an integrated manner. The third adhesive portion 530 may extend along the 2-1 perimeter portion 421. When the 1-1 adhesive portion 511 and the 1-2 adhesive portion 512 having the first width $W_1$ are arranged at the 2-1 perimeter portion 421 formed in a 3D curved structure, the 1-1 adhesive portion 511 and the 1-2 adhesive portion 512 may be deformed, i.e., may be creased, which may lead to deterioration of the dust and water proof function. However, when the third adhesive portion 530 having the second width $W_2$, which is less than the first width $W_1$, is arranged at the 2-1 perimeter portion 421, a degree of deformation of the third adhesive portion 530 may be minimized. Also, as the second adhesive portion 520 may be arranged adjacent to the third adhesive portion 530, moisture, dust, etc. from outside may be blocked by the second adhesive portion 520. Moreover, as described above, as the third adhesive portion 530 may have a certain thickness, it may prevent the second adhesive portion 520 from leaving the first housing 310. Although the aforementioned embodiment provides the case where the 1-1 adhesive portion 511, the third adhesive portion 530, and the 1-2 adhesive portion 512 are formed in an integrated manner, the disclosure is not limited thereto, and the 1-1 adhesive portion 511, the third adhesive portion 530, and the 1-2 adhesive portion 512 may be formed separately, and connected to each other.

Referring to FIG. 14B, the third adhesive portion 530 according to an embodiment may include a slit 531. As described above with reference to FIG. 14A, when the third adhesive portion 530 in the form of a band is arranged at the 2-1 perimeter portion 421 having a 3D curved structure, the deformation of the third adhesive portion 530 may be minimized; however, it may be difficult to predict the deformation degree and spot and design the third adhesive portion 530 accordingly. In consideration of such an issue, the slit 531 may be included in a part of the third adhesive portion 530. There may be a single slit 531 or a plurality of slits 531 according to an embodiment, and a location of the slit 531 may be selected considering a curvature of the 2-1 perimeter portion 421 and the deformation spot of the third adhesive portion 530 based thereon.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
 a first housing;
 a second housing coupled to the first housing;
 a plurality of first adhesive portions arranged between the first housing and the second housing, and spaced apart from each other along a first perimeter portion of the first housing;
 a plurality of second adhesive portions arranged between the plurality of first adhesive portions and arranged along a second perimeter portion of the first housing, and
 an adhesive portion accommodating portion arranged along the second perimeter portion, recessed downwards in a thickness direction of the electronic device, and accommodating part of the plurality of second adhesive portions,
 wherein the plurality of first adhesive portions include an adhesive support portion extending in one direction and a first adhesive material arranged on one side or both sides of the adhesive support portion, and
 wherein the plurality of second adhesive portions include a second adhesive material.

2. The electronic device of claim 1,
 wherein the second perimeter portion and the first perimeter portion have a curved structure bent in a thickness direction of the electronic device, and
 wherein a curvature of the second perimeter portion extending along a plane perpendicular to the thickness direction of the electronic device exceeds a curvature of the first perimeter portion.

3. The electronic device of claim 1, further comprising a protruding support portion protruding one side of from the first housing in a thickness direction of the electronic device and spaced apart from the plurality of second adhesive portions.

4. The electronic device of claim 3,
 wherein the plurality of first adhesive portions have a first thickness in the thickness direction of the electronic device,
 wherein the protruding support portion has a second thickness in the thickness direction of the electronic device, and
 wherein the second thickness is greater than or equal to 50% of the first thickness.

5. The electronic device of claim 1,
 wherein the plurality of first adhesive portions include at both ends thereof a first joint portion,
 wherein the plurality of second adhesive portions include at both ends thereof a second joint portion connected to the first joint portion,
 wherein the first joint portion has a protruding shape, and
 wherein the second joint portion has a grooved shape corresponding to the protruding shape.

6. The electronic device of claim 1,
 wherein the plurality of first adhesive portions include at both ends thereof a first joint portion,
 wherein the plurality of second adhesive portions include at both ends thereof a second joint portion connected to the first joint portion, and
 wherein the first joint portion and the second joint portion are formed in zigzags corresponding to each other.

7. The electronic device of claim 1, wherein a lower surface of the adhesive portion accommodating portion includes one or more structures from a stepped portion, a recessed portion, and a convex portion.

8. The electronic device of claim 1, further comprising an adhesive portion support portion protruding one side of from the first housing in the thickness direction of the electronic device and spaced apart from the adhesive portion accommodating portion.

9. The electronic device of claim 8, wherein the adhesive portion support portion extends along the second perimeter portion of the first housing.

10. The electronic device of claim 8,
wherein there are a plurality of adhesive portion support portions, and
wherein the plurality of adhesive portion support portions are spaced apart from each other along the second perimeter portion of the first housing.

11. The electronic device of claim 1, further comprising a first adhesive portion channel extending from the adhesive portion accommodating portion.

12. The electronic device of claim 1, further comprising a second adhesive portion channel spaced apart and extending from the adhesive portion accommodating portion.

13. The electronic device of claim 1, wherein the adhesive portion accommodating portion includes a first adhesive portion accommodating portion and a second adhesive portion accommodating portion spaced apart from each other.

14. The electronic device of claim 13, further comprising a third adhesive portion channel connecting the first adhesive portion accommodating portion to the plurality of second adhesive portion accommodating portion.

15. The electronic device of claim 13, further comprising:
a protruding support portion protruding in the thickness direction of the electronic device and spaced apart from the plurality of second adhesive portions,
wherein the protruding support portion is arranged between the first adhesive portion accommodating portion and the plurality of second adhesive portion accommodating portion.

16. The electronic device of claim 1, further comprising:
a third adhesive portion connected to a first adhesive portion and having a width less than that of the first adhesive portion,
wherein the third adhesive portion extends along the second perimeter portion.

17. The electronic device of claim 16, wherein the third adhesive portion includes a slit.

18. The electronic device of claim 1, wherein the second adhesive material comprises a thermosetting or photocurable second adhesive material.

19. The electronic device of claim 1, wherein elasticity or strain of the second adhesive material is greater than that of the adhesive support portion.

* * * * *